US011756598B2

(12) United States Patent
Lee et al.

(10) Patent No.: US 11,756,598 B2
(45) Date of Patent: Sep. 12, 2023

(54) ELECTRONIC DEVICE FOR PERFORMING DATA ALIGNMENT OPERATION

(71) Applicant: SK hynix Inc., Icheon-si (KR)

(72) Inventors: Gang Sik Lee, Icheon-si (KR); Joo Hyung Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 17/472,411

(22) Filed: Sep. 10, 2021

(65) Prior Publication Data

US 2022/0415374 A1 Dec. 29, 2022

(30) Foreign Application Priority Data

Jun. 24, 2021 (KR) .......................... 10-2021-0082613

(51) Int. Cl.
*G11C 7/22* (2006.01)
*G11C 7/14* (2006.01)
*H03L 7/081* (2006.01)
*H03L 7/099* (2006.01)
*H03L 7/091* (2006.01)
*G11C 7/06* (2006.01)

(52) U.S. Cl.
CPC ............. *G11C 7/222* (2013.01); *G11C 7/062* (2013.01); *G11C 7/14* (2013.01); *H03L 7/0814* (2013.01); *H03L 7/091* (2013.01); *H03L 7/0992* (2013.01)

(58) Field of Classification Search
CPC ........... G11C 7/222; G11C 7/062; G11C 7/14; G11C 7/1066; G11C 7/1093; G11C 29/56012; G11C 7/1045; G11C 2207/229; H03L 7/0814; H03L 7/091; H03L 7/0992
USPC ....................................... 365/233.1
See application file for complete search history.

(56) References Cited

U.S. PATENT DOCUMENTS

| 7,269,212 | B1 | 9/2007 | Chau et al. | |
| 2005/0265440 | A1* | 12/2005 | Sohn | H03L 7/0807 375/233 |
| 2017/0179938 | A1* | 6/2017 | Park | H03K 5/1506 |

FOREIGN PATENT DOCUMENTS

| CN | 111159081 A | * | 5/2020 | ........... G11C 7/1048 |
| DE | 102005022684 A1 | * | 12/2005 | ........... H03L 7/0814 |
| KR | 101006430 B1 | | 1/2011 | |

\* cited by examiner

*Primary Examiner* — Fernando Hidalgo
(74) *Attorney, Agent, or Firm* — WILLIAM PARK & ASSOCIATES LTD.

(57) ABSTRACT

An electronic device includes a dock dividing circuit configured to generate sampling clocks, alignment clocks and output clocks by dividing a frequency of a write clock; and a data alignment circuit configured to, in a first operation mode, receive input data having any one level among a first level to a fourth level and generate alignment data by aligning the input data in synchronization with the sampling clocks, the alignment clocks and the output clocks, and to, in a second operation mode, receive the input data having any one level of the first level and the fourth level and generate the alignment data by aligning the input data in synchronization with the sampling clocks, the alignment clocks and the output clocks.

20 Claims, 18 Drawing Sheets

FIG. 9
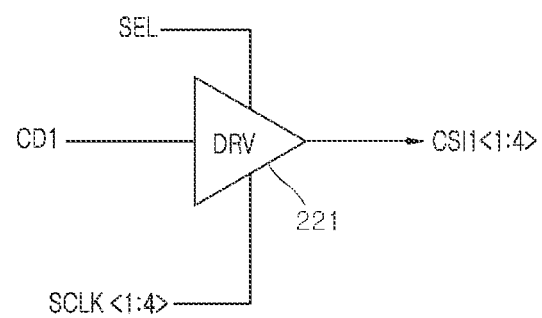
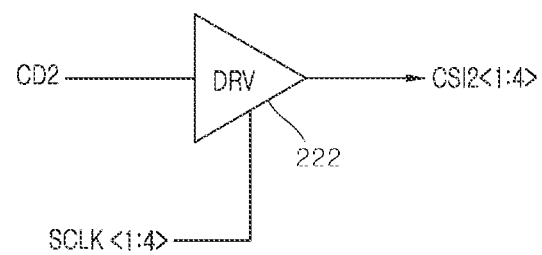
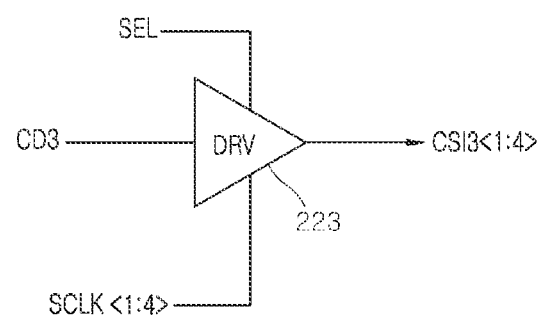

FIG. 11

| CIS1<1> | CIS2<1> | CIS3<1> | ED<1> | ED<2> |
|---|---|---|---|---|
| H | H | H | H | H |
| L | H | H | H | L |
| L | L | H | L | H |
| L | L | L | L | L |

ELECTRONIC DEVICE FOR PERFORMING DATA ALIGNMENT OPERATION

CROSS-REFERENCE TO RELATED APPLICATION

The present application claims priority under 35 U.S.C. § 119(a) to Korean application number 10-2021-0082613, filed in the Korean Intellectual Property Office on Jun. 24, 2021, the entire disclosure of which is incorporated herein by reference in its entirety.

BACKGROUND

1. Technical Field

Embodiments of the present disclosure may generally relate to an electronic device, and more particularly an electronic device configured to perform a data alignment operation according to an operating speed.

2. Related Art

Recently, in order to increase the operating speed of a semiconductor device, various schemes for inputting/outputting data including a plurality of bits per clock cycle have been used. For example, a return-to-zero (RZ) format, a non-return-to-zero (NRZ) format and a four-level pulse amplitude modulation (PAM4) format are used.

In the return-to-zero format, when a hit of a logic high level in data including a plurality of bits is input/output, the bit maintains the logic high level and then immediately returns to a logic low level. In the non-return-to-zero format, each of a bit of a logic high level and a bit of a logic low level in data including a plurality of bits each maintain its logic level till a time point when a next bit is input. In the four-level pulse amplitude modulation format, 2-bit data is input/output per pulse by adjusting a pulse amplitude of data to four levels when the data is input/output. In the four-level pulse amplitude modulation (PAM4) format, three comparators are used to identify 2-bit data, and 2-bit data is identified in such a way to encode output signals of the respective comparators.

SUMMARY

In an embodiment, an electronic device may include: a comparison circuit configured to generate first to third comparison signals by receiving input data having any one level among a first level to a fourth level in a first operation mode, and generate the second comparison signal by receiving the input data having any one level of the first level and the fourth level in a second operation mode; a sampling circuit configured to generate first to third sampling data from the first to third comparison signals in synchronization with a sampling clock in the first operation mode, and generate the second sampling data from the second comparison signal in the second operation mode; and an alignment circuit configured to align the first to third sampling data in synchronization with an alignment clock and an output clock and generate alignment data on the basis of the aligned first to third sampling data, or align the second sampling data in synchronization with the alignment clock and the output clock and generate the alignment data on the basis of the aligned second sampling data.

In an embodiment, an electronic device may include: a clock dividing circuit configured to generate first to fourth sampling clocks, first to fourth alignment clocks and first and second output clocks by dividing a frequency of a write clock; and a data alignment circuit configured to, in a first operation mode, receive input data having any one level among a first level to a fourth level and generate alignment data by aligning the input data in synchronization with the first to fourth sampling clocks, the first to fourth alignment clocks and the first and second output clocks, and to, in a second operation mode, receive the input data having any one level of the first level and the fourth level and generate the alignment data by aligning the input data in synchronization with the first to fourth sampling clocks, the first to fourth alignment clocks and the first and second output clocks.

BRIEF DESCRIPTION OF THE DRAWINGS

FIG. 9 is a diagram illustrating a configuration of a sampling circuit included in the electronic device illustrated in FIG. 1.

FIG. 11 is a table to assist in the explanation of the operation of an encoder illustrated in FIG. 10.

DETAILED DESCRIPTION

Figure 1:
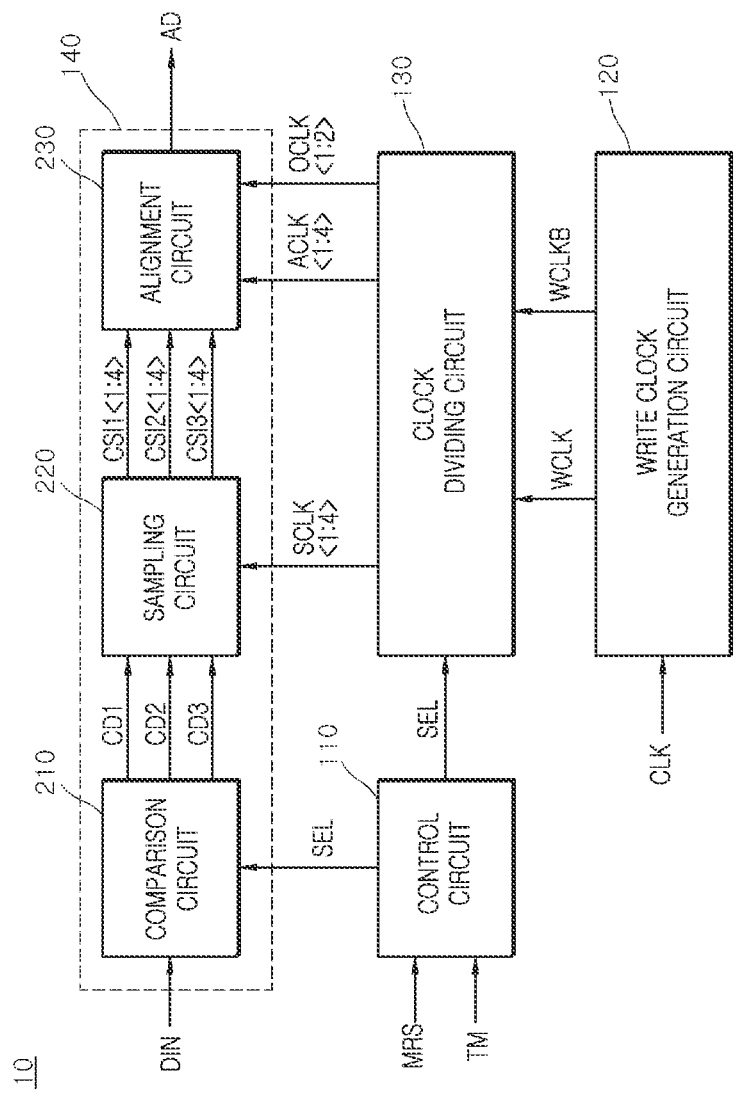
FIG. 1 is a block diagram illustrating a configuration of an electronic device in accordance with an embodiment of the present disclosure.

The term "preset" means that the numerical value of a parameter is predetermined when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to provide examples of the teachings of the present disclosure, and the scope of the present disclosure is not limited by the embodiments.

Some embodiments of the present disclosure may be directed to an electronic device capable of supporting a first operation mode in which, during a data alignment operation, a pulse amplitude of data is adjusted to four levels and 2-bit data is input/output per pulse and a second operation mode in which, during a data alignment operation, a bit of a logic high level and a bit of a logic low level in data each maintain its logic level till a time point when a next bit is input.

According to the embodiments of the present disclosure, it may be possible to support a first operation mode in which, during a data alignment operation, a pulse amplitude of data is adjusted to four levels and 2-bit data is input/output per pulse and a second operation mode in which, during a data alignment operation, a bit of a logic high level and a bit of a logic low level in data each maintain its logic level till a time point when a next bit is input.

Also, according to the embodiments of the present disclosure, it may be possible to secure the reliability of the data alignment operation by selectively performing the first operation mode and the second operation mode in conformity with a high-speed operation and a low-speed operation during the data alignment operation.

As illustrated in FIG. 1, an electronic device 10 in accordance with an embodiment of the present disclosure may include a control circuit 110, a write clock generation circuit 120, a clock dividing circuit 130 and a data alignment circuit 140.

The control circuit 110 may generate a selection signal SEL in a mode register set operation and a test mode. The control circuit 110 may generate the selection signal SEL which is enabled to enter a first operation mode by a mode register set signal MRS in the mode register set operation. The control circuit 110 may generate the selection signal SEL which is disabled to enter a second operation mode by the mode register set signal MRS in the mode register set operation. The control circuit 110 may generate the selection signal SEL which is enabled to enter the first operation mode by a test mode signal TM in the test mode. The control circuit 110 may generate the selection signal SEL which is disabled to enter the second operation mode by the test mode signal TM in the test mode.

The mode register set operation may be set as an operation of storing and outputting information for controlling the operation of the electronic device 10. The test mode may be set as an operation for an external device to test the operation of the electronic device 10. The first operation mode may be set as a four-level pulse amplitude modulation (PAM4) format in which 2-bit data is input/output per pulse by adjusting a pulse amplitude of data to four levels when the data is input/output. The first operation mode may be performed when the electronic device 10 inputs/outputs data in a high-speed operation. The second operation mode may be set as a non-return-to-zero format in which a bit of a logic high level and a bit of a logic low level in data including a plurality of bits each maintain its logic level till a time point when a next bit is input. The second operation mode may be performed when the electronic device 10 inputs/outputs data in a low-speed operation.

The write clock generation circuit 120 may generate a write clock WCLK and an inverted write clock WCLKB by receiving a clock CLK from the external device of the electronic device 10. The write clock generation circuit 120 may generate the write clock WCLK which has the same phase as the clock CLK input from the external device. The write clock generation circuit 120 may generate the inverted write clock WCLKB which has a phase opposite to that of the clock CLK input from the external device. The clock CLK may be set as a signal which periodically toggles to synchronize the operation of the electronic device 10 with the external device.

The clock dividing circuit 130 may receive the selection signal SEL from the control circuit 110. The clock dividing circuit 130 may receive the write clock WCLK and the inverted write clock WCLKB from the write clock generation circuit 120. The clock dividing circuit 130 may generate first to fourth sampling clocks SCLK<1:4>, first to fourth alignment clocks ACLK<1:4> and first and second output clocks OCLK<1:2> by dividing frequencies of the write clock WCLK and the inverted write clock WCLKB according to the selection signal SEL. When the selection signal SEL is enabled and thus the first operation mode is performed, the clock dividing circuit 130 may generate the first to fourth sampling clocks SCLK<1:4> by dividing by 2 the frequencies of the write clock WCLK and the inverted write clock WCLKB. When the selection signal SEL is enabled and thus the first operation mode is performed, the clock dividing circuit 130 may generate the first to fourth alignment clocks ACLK<1:4> by dividing by 2 the frequencies of the write clock WCLK and the inverted write clock WCLKB. When the selection signal SEL is enabled and thus the first operation mode is performed, the clock dividing circuit 130 may generate the first and second output clocks OCLK<1:2> by dividing by 4 the frequencies of the write clock WCLK and the inverted write clock WCLKB. When the selection signal SEL is disabled and thus the second operation mode is performed, the clock dividing circuit 130 may generate the first to fourth sampling clocks SCLK<1:4> by dividing by 2 the frequencies of the write clock WCLK and the inverted write clock WCLKB. When the selection signal SEL is disabled and thus the second operation mode is performed, the clock dividing circuit 130 may generate the first to fourth alignment clocks ACLK<1:4> by dividing by 4 the frequencies of the write clock WCLK and the inverted write clock WCLKB. When the selection signal SEL is disabled and thus the second operation mode is performed, the clock dividing circuit 130 may generate the first and second output clocks OCLK<1:2> by dividing by 8 the frequencies of the write clock WCLK and the inverted write clock WCLKB.

The data alignment circuit 140 may include a comparison circuit 210, a sampling circuit 220 and an alignment circuit 230.

The comparison circuit 210 may receive input data DIN having any one level among a first level to a fourth level in the first operation mode. The comparison circuit 210 may receive the input data DIN having any one level of the first level and the fourth level in the second operation mode. The comparison circuit 210 may receive the selection signal SEL from the control circuit 110. In the first operation mode, the comparison circuit 210 may generate a first comparison signal CD1, a second comparison signal CD2 and a third comparison signal CD3 on the basis of the input data DIN having any one level among the first level to the fourth level. In the second operation mode, the comparison circuit 210 may generate the second comparison signal CD2 on the basis of the input data DIN having any one level of the first level and the fourth level.

The sampling circuit 220 may receive the first comparison signal CD1, the second comparison signal CD2 and the third comparison signal CD3 from the comparison circuit 210. The sampling circuit 220 may receive the first to fourth sampling clocks SCLK<1:4> from the clock dividing circuit 130. In the first operation mode, the sampling circuit 220 may generate first sampling data CSI1<1:4>, second sampling data CSI2<1:4> and third sampling data CSI3<1:4> from the first comparison signal CD1, the second comparison signal CD2 and the third comparison signal CD3 in synchronization with the first to fourth sampling clocks SCLK<1:4>. In the second operation mode, the sampling circuit 220 may generate the second sampling data CSI2<1:4> from the second comparison signal CD2 in synchronization with the first to fourth sampling clocks SCLK<1:4>.

The alignment circuit 230 may receive the first sampling data CSI1<1:4>, the second sampling data CSI2<1:4> and the third sampling data CSI3<1:4> from the sampling circuit 220. The alignment circuit 230 may receive the first to fourth alignment clocks ACLK<1:4> and the first and second output clocks OCLK<1:2> from the clock dividing circuit 130. In the first operation mode, the alignment circuit 230 may align the first sampling data CSI1<1:4>, the second sampling data CSI2<1:4> and the third sampling data CSI3<1:4> in synchronization with the first to fourth alignment clocks ACLK<1:4> and the first and second output clocks OCLK<1:2>. The alignment circuit 230 may generate alignment data AD on the basis of the first sampling data CSI1<1:4>, the second sampling data CSI2<1:4> and the third sampling data CSI3<1:4> aligned in the first operation mode. In the second operation mode, the alignment circuit 230 may align the second sampling data CSI2<1:4> in synchronization with the first to fourth alignment clocks ACLK<1:4> and the first and second output clocks OCLK<1:2>. The alignment circuit 230 may generate the alignment data AD on the basis of the second sampling data CSI2<1:4> aligned in the second operation mode.

In the first operation mode, the data alignment circuit 140 may receive the input data DIN having any one level among the first level to the fourth level from the external device. In the first operation mode, the data alignment circuit 140 may generate the alignment data AD by aligning the input data DIN in synchronization with the first to fourth sampling clocks SCLK<1:4>, the first to fourth alignment clocks ACLK<1:4> and the first and second output clocks OCLK<1:2>. In the second operation mode, the data alignment circuit 140 may receive the input data DIN having any one level of the first level and the fourth level from the external device. In the second operation mode, the data alignment circuit 140 may generate the alignment data AD by aligning the input data DIN in synchronization with the first to fourth sampling clocks SCLK<1:4>, the first to fourth alignment clocks ACLK<1:4> and the first and second output clocks OCLK<1:2>. The input data DIN including a plurality of bits which are sequentially input may be input in series. The alignment data AD including a plurality of bits which are simultaneously generated may be generated in parallel. The input data DIN having any one level among the first level to the fourth level in the first operation mode and the second operation mode will be described later with reference to FIGS. 7 and 8. The operation of generating the alignment data AD from the input data DIN in the data alignment circuit 140 illustrated in FIG. 1 will be described later with reference to FIGS. 12 to 17.

Figure 2:
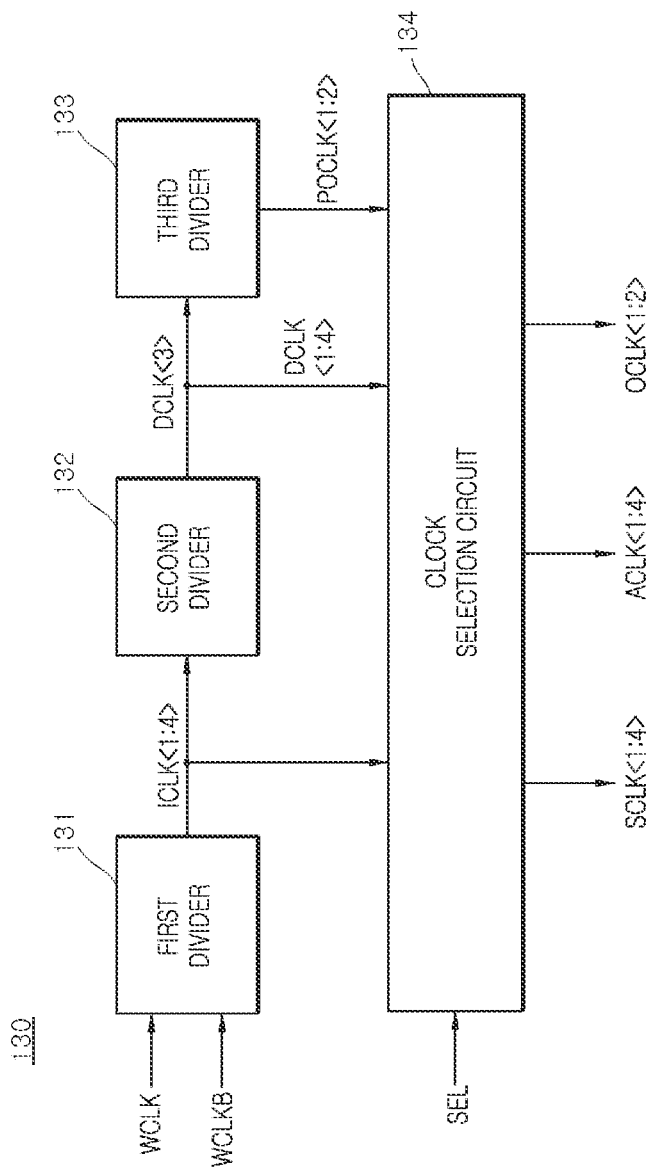
FIG. 2 is a block diagram illustrating a configuration of a clock dividing circuit included in the electronic device illustrated in FIG. 1.

FIG. 2 is a block diagram illustrating an embodiment of the clock dividing circuit 130. As illustrated in FIG. 2, the clock dividing circuit 130 may include a first divider 131, a second divider 132, a third divider 133 and a clock selection circuit 134.

The first divider 131 may generate first to fourth internal clocks ICLK<1:4> by dividing by 2, the frequencies of the write clock WCLK and the inverted write clock WCLKB. In an embodiment, the first divider 131 may generate first to fourth internal clocks ICLK<1:4> by dividing by 2 the frequencies of the write clock WCLK. The respective first to fourth internal clocks ICLK<1:4> may be generated to have a phase difference of 90° (i.e., 90 degrees). The first to fourth internal clocks ICLK<1:4> may be generated to have frequencies ½ times the frequency of the write clock WCLK.

The second divider 132 may generate first to fourth divided clocks DCLK<1:4> by dividing by 2, the frequencies of the first to fourth internal clocks ICLK<1:4>. The respective first to fourth divided clocks DCLK<1:4> may be generated to have a phase difference of 90°. The first to fourth divided clocks DCLK<1:4> may be generated to have frequencies ¼ times the frequency of the write clock WCLK.

The third divider 133 may generate first and second pre-output clocks POCLK<1:2> by dividing by 2, the frequency of the third divided clock DCLK<3>. The respective first and second pre-output clocks POCLK<1:2> may be generated to have a phase difference of 180°. The first and second pre-output clocks POCLK<1:2> may be generated to have frequencies ⅛ times the frequency of the write clock WCLK.

The clock selection circuit 134 may generate the first to fourth sampling clocks SCLK<1:4> from the first to fourth internal clocks ICLK<1:4>. The clock selection circuit 134 may output the first to fourth internal clocks ICLK<1:4> as the first to fourth sampling clocks SCLK<1:4> in the first operation mode and the second operation mode. The clock selection circuit 134 may generate the first to fourth alignment clocks ACLK<1:4> and the first and second output clocks OCLK<1:2> from the first to fourth internal clocks ICLK<1:4>, the first to fourth divided clocks DCLK<1:4> and the first and second pre-output clocks POCLK<1:2>, depending on a logic level of the selection signal SEL. The operation in which the clock selection circuit 134 generates the first to fourth alignment clocks ACLK<1:4> and the first and second output clocks OCLK<1:2> from the first to fourth internal clocks ICLK<1:4>, the first to fourth divided clocks DCLK<1:4> and the first and second pre-output clocks POCLK<1:2> will be described below with reference to FIG. 3.

Figure 3:
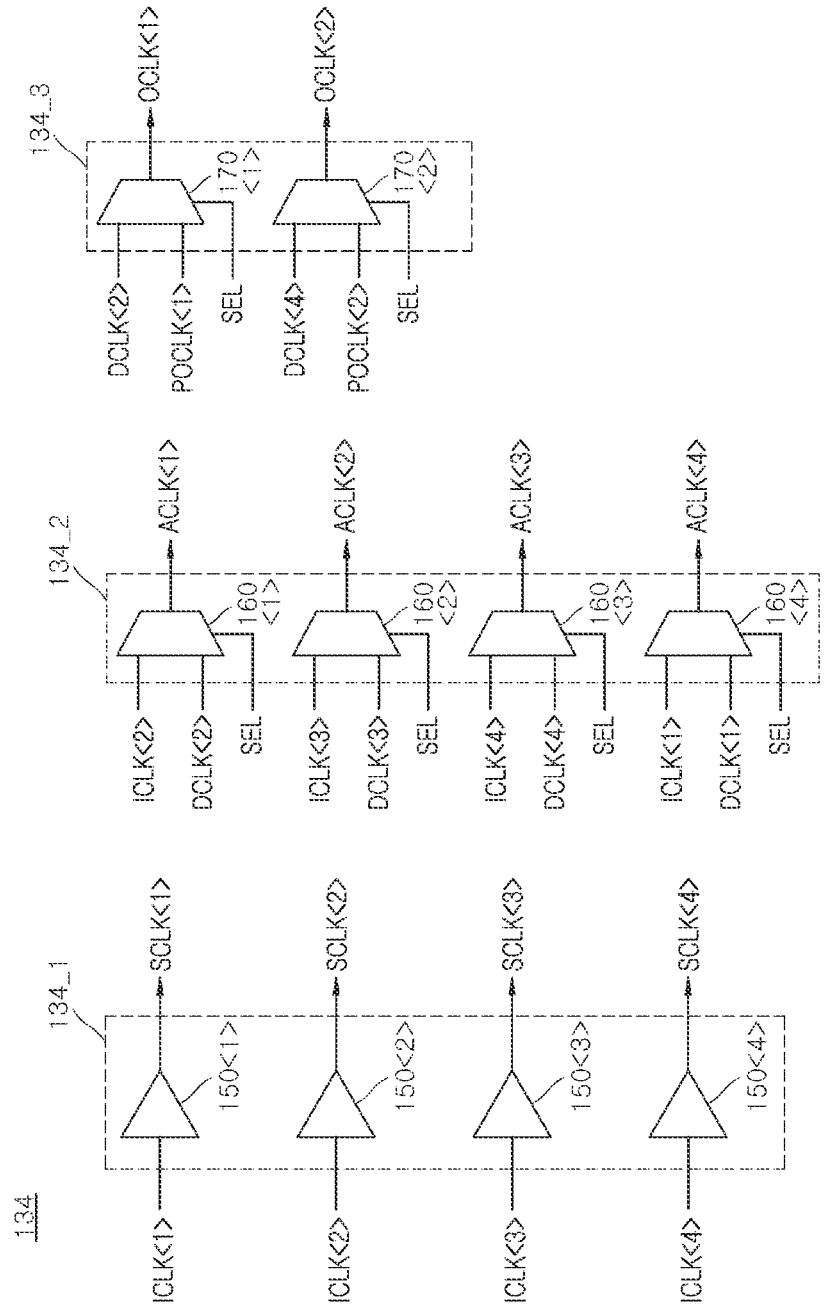
FIG. 3 is a circuit diagram illustrating a configuration of a clock selection circuit included in the clock dividing circuit illustrated in FIG. 2.

FIG. 3 is a circuit diagram illustrating an embodiment of the clock selection circuit 134. As illustrated in FIG. 3, the clock selection circuit 134 may include a sampling clock generation circuit 134_1, an alignment clock generation circuit 134_2 and an output clock generation circuit 134_3.

The sampling clock generation circuit 134_1 may include a first buffer 150<1>, a second buffer 150<2>, a third buffer 150<3> and a fourth buffer 150<4>.

The first buffer 150<1> may generate the first sampling clock SCLK<1> by buffering the first internal clock ICLK<1>.

The second buffer 150<2> may generate the second sampling clock SCLK<2> by buffering the second internal clock ICLK<2>.

The third buffer 150<3> may generate the third sampling clock SCLK<3> by buffering the third internal clock ICLK<3>.

The fourth buffer 150<4> may generate the fourth sampling clock SCLK<4> by buffering the fourth internal clock ICLK<4>.

The alignment clock generation circuit 134_2 may include a first multiplexer 160<1>, a second multiplexer 160<2>, a third multiplexer 160<3> and a fourth multiplexer 160<4>.

The first multiplexer 160<1> may output any one of the second internal clock ICLK<2> and the second divided clock DCLK<2> as the first alignment clock ACLK<1> depending on a logic level of the selection signal SEL. The first multiplexer 160<1> may output the second internal clock ICLK<2> as the first alignment clock ACLK<1> when the selection signal SEL is a logic high level. The first multiplexer 160<1> may output the second divided clock DCLK<2> as the first alignment clock ACLK<1> when the selection signal SEL is a logic low level.

The second multiplexer 160<2> may output any one of the third internal clock ICLK<3> and the third divided clock DCLK<3> as the second alignment clock ACLK<2> depending on a logic level of the selection signal SEL. The second multiplexer 160<2> may output the third internal clock ICLK<3> as the second alignment clock ACLK<2> when the selection signal SEL is a logic high level. The second multiplexer 160<2> may output the third divided clock DCLK<3> as the second alignment clock ACLK<2> when the selection signal SEL is a logic low level.

The third multiplexer 160<3> may output any one of the fourth internal clock ICLK<4> and the fourth divided clock DCLK<4> as the third alignment clock ACLK<3> depending on a logic level of the selection signal SEL. The third multiplexer 160<3> may output the fourth internal clock ICLK<4> as the third alignment clock ACLK<3> when the selection signal SEL is a logic high level. The third multiplexer 160<3> may output the fourth divided clock DCLK<4> as the third alignment clock ACLK<3> when the selection signal SEL is a logic low level.

The fourth multiplexer 160<4> may output any one of the first internal clock ICLK<1> and the first divided clock DCLK<1> as the fourth alignment clock ACLK<4> depending on a logic level of the selection signal SEL. The fourth multiplexer 160<4> may output the first internal clock ICLK<1> as the fourth alignment clock ACLK<4> when the selection signal SEL is a logic high level. The fourth multiplexer 160<4> may output the first divided clock DCLK<1> as the fourth alignment clock ACLK<4> when the selection signal SEL is a logic low level.

The output clock generation circuit 134_3 may include a fifth multiplexer 170<1> and a sixth multiplexer 170<2>.

The fifth multiplexer 170<1> may output any one of the second divided clock DCLK<2> and the first pre-output clock POCLK<1> as the first output clock OCLK<1> depending on a logic level of the selection signal SEL. The fifth multiplexer 170<1> may output the second divided clock DCLK<2> as the first output clock OCLK<1> when the selection signal SEL is a logic high level. The fifth multiplexer 170<1> may output the first pre-output clock POCLK<1> as the first output clock OCLK<1> when the selection signal SEL is a logic low level.

The sixth multiplexer 170<2> may output any one of the fourth divided clock DCLK<4> and the second pre-output clock POCLK<2> as the second output clock OCLK<2> depending on a logic level of the selection signal SEL. The sixth multiplexer 173<2> may output the fourth divided clock DCLK<4> as the second output clock OCLK<2> when the selection signal SEL is a logic high level. The sixth multiplexer 170<2> may output the second pre-output clock POCLK<2> as the second output clock OCLK<2> when the selection signal SEL is a logic low level.

Figure 4:
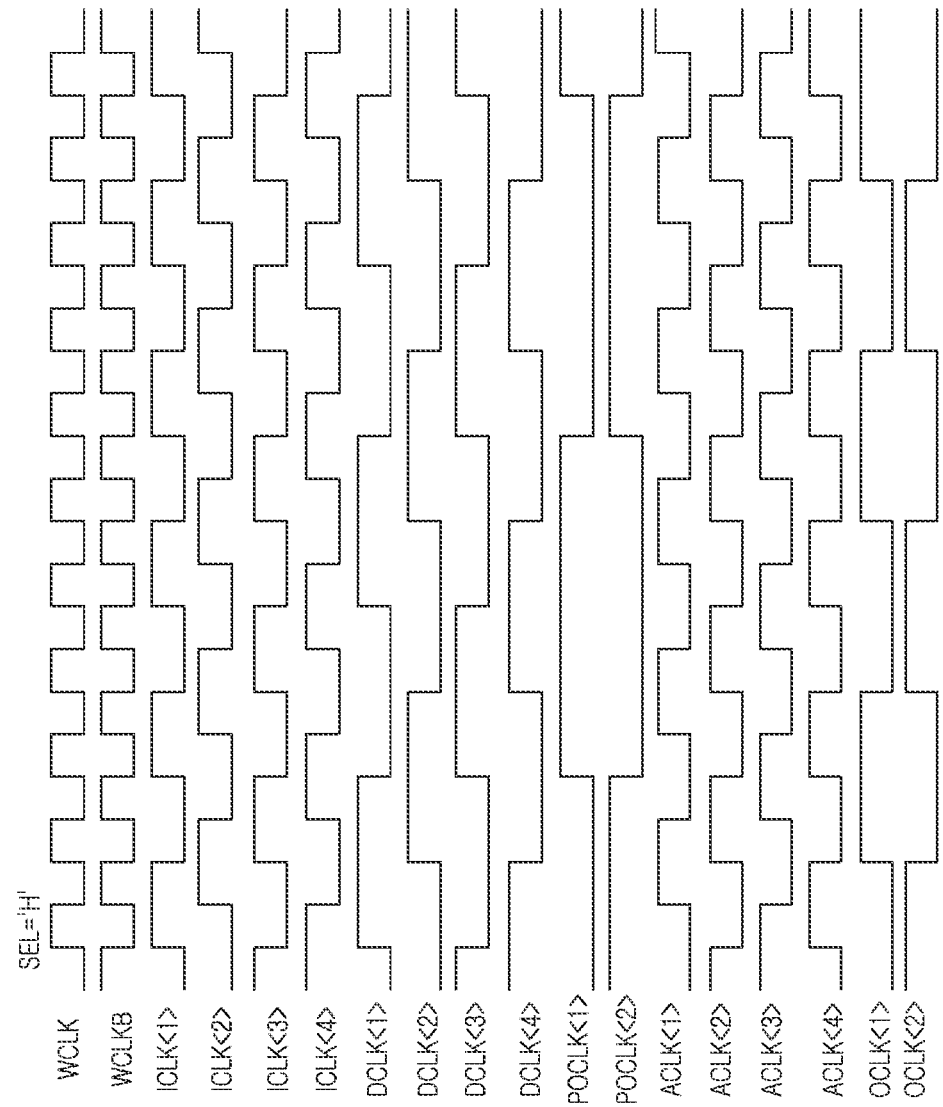
FIGS. 4 and 5 are diagrams to assist in the explanation of the operation of the clock dividing circuit illustrated in FIG. 2.

FIG. 4 is a diagram to assist in the explanation of the operation of the clock dividing circuit 130 in the first operation mode.

Prior to description, the control circuit 110 generates the selection signal SEL which is enabled to a logic high level to enter the first operation mode.

The clock dividing circuit 130 generates the first to fourth internal clocks ICLK<1:4> by dividing by 2 the frequencies of the write clock WCLK and the inverted write clock WCLKB. The respective first to fourth internal clocks ICLK<1:4> are generated to have a phase difference of 90°. The clock dividing circuit 130 generates the first to fourth divided clocks DCLK<1:4> by dividing by 4 the frequencies of the write clock WCLK and the inverted write clock WCLKB. The respective first to fourth divided clocks DCLK<1:4> are generated to have a phase difference of 90°. The clock dividing circuit 130 generates the first and second pre-output clocks POCLK<1:2> by dividing by 8 the frequencies of the write clock WCLK and the inverted write clock WCLKB. The respective first and second pre-output clocks POCLK<1:2> are generated to have a phase difference of 180°.

The clock dividing circuit 130 generates the first to fourth sampling clocks SCLK<1:4> from the first to fourth internal clocks ICLK<1:4>. Since the first to fourth sampling clocks SCLK<1:4> are generated to have the same frequencies and the same phases as the first to fourth internal clocks ICLK<1:4>, description thereof will be omitted herein.

The clock dividing circuit 130 generates the first to fourth alignment clocks ACLK<1:4> from the first to fourth internal clocks ICLK<1:4> by receiving the selection signal SEL of a logic high level. The first to fourth alignment clocks ACLK<1:4> are generated to have frequencies ½ times the frequency of the write clock WCLK. The clock dividing circuit 130 generates the first alignment clock ACLK<1> from the second internal clock ICLK<2>. The clock dividing circuit 130 generates the second alignment clock ACLK<2> from the third internal clock ICLK<3>. The clock dividing circuit 130 generates the third alignment clock ACLK<3> from the fourth internal clock ICLK<4>. The clock dividing circuit 130 generates the fourth alignment clock ACLK<4> from the first internal clock ICLK<1>.

The clock dividing circuit 130 generates the first and second output clocks OCLK<1:2> from the second divided clock DCLK<2> and the fourth divided clock DCLK<4> by receiving the selection signal SEL of a logic high level. The first and second output clocks OCLK<1:2> are generated to have frequencies ¼ times the frequency of the write clock WCLK. The clock dividing circuit 130 generates the first output clock OCLK<1> from the second divided clock DCLK<2>. The clock dividing circuit 130 generates the second output clock OCLK<2> from the fourth divided clock DCLK<4>.

Figure 5:
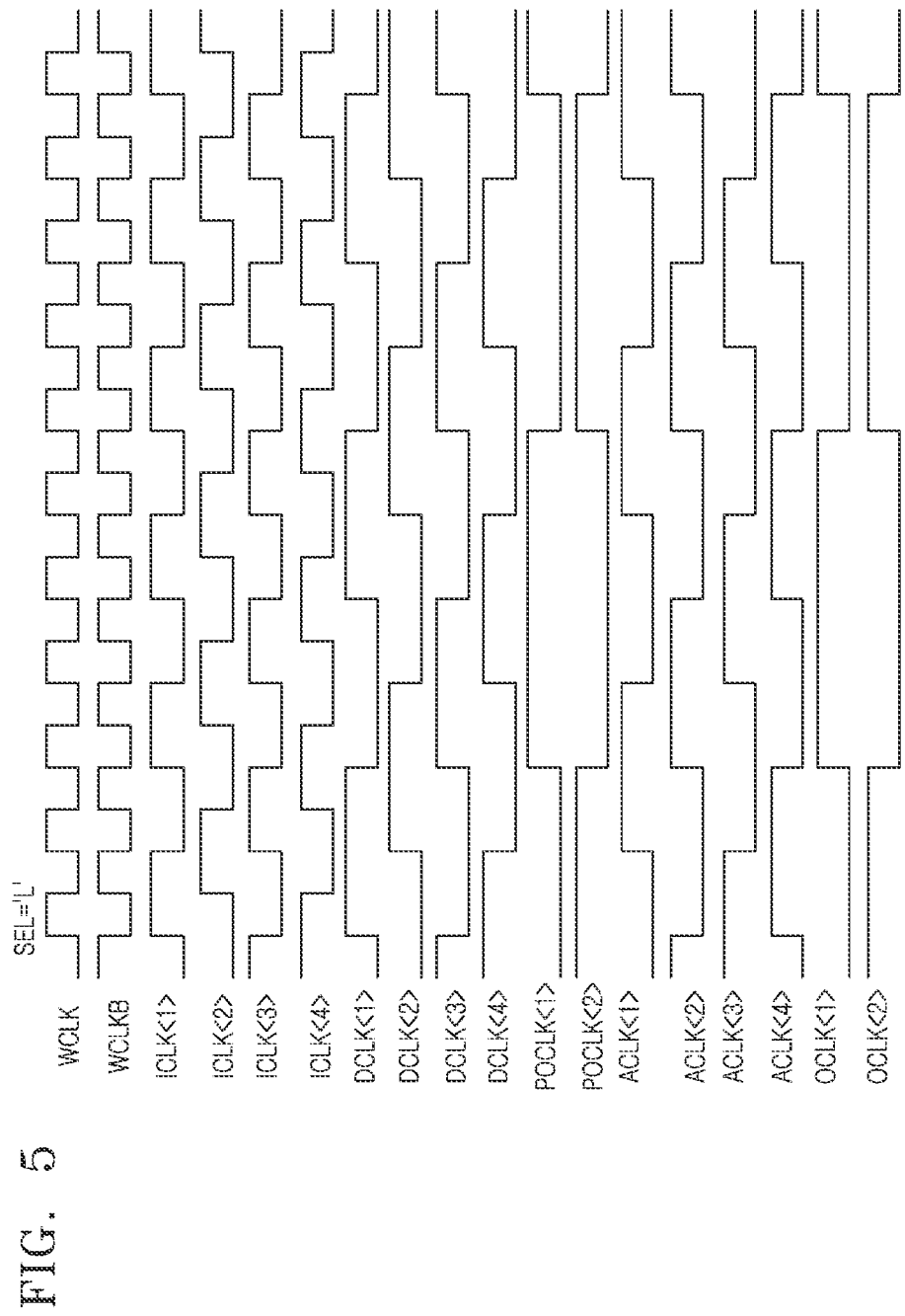

FIG. 5 is a diagram to assist in the explanation of the operation of the clock dividing circuit 130 in the second operation mode.

Prior to description, the control circuit 110 generates the selection signal SEL which is disabled to a logic low level to enter the second operation mode.

The clock dividing circuit 130 generates the first to fourth internal clocks ICLK<1:4> by dividing by 2 the frequencies of the write clock WCLK and the inverted write clock WCLKB. The respective first to fourth internal clocks ICLK<1:4> are generated to have a phase difference of 90°. The clock dividing circuit 130 generates the first to fourth divided clocks DCLK<1:4> by dividing by 4 the frequencies of the write clock WCLK and the inverted write clock WCLKB. The respective first to fourth divided clocks DCLK<1:4> are generated to have a phase difference of 90°. The clock dividing circuit 130 generates the first and second pre-output clocks POCLK<1:2> by dividing by 8 the frequencies of the write clock WCLK and the inverted write clock WCLKB. The respective first and second pre-output clocks POCLK<1:2> are generated to have a phase difference of 180°.

The clock dividing circuit 130 generates the first to fourth sampling clocks SCLK<1:4> from the first to fourth internal clocks ICLK<1:4>. The first to fourth sampling clocks SCLK<1:4> are generated to have frequencies ½ times the frequency of the write clock WCLK. Since the first to fourth sampling clocks SCLK<1:4> are generated to have the same frequencies and the same phases as the first to fourth internal clocks ICLK<1:4>, description thereof will be omitted herein.

The clock dividing circuit 130 generates the first to fourth alignment clocks ACLK<1:4> from the first to fourth divided clocks DCLK<1:4> by receiving the selection signal SEL of a logic low level. The first to fourth alignment clocks ACLK<1:4> are generated to have frequencies ¼ times the frequency of the write clock WCLK. The clock dividing circuit 130 generates the first alignment clock ACLK<1> from the second divided clock DCLK<2>. The clock dividing circuit 130 generates the second alignment clock ACLK<2> from the third divided clock DCLK<3>. The clock dividing circuit 130 generates the third alignment clock ACLK<3> from the fourth divided clock DCLK<4>. The clock dividing circuit 130 generates the fourth alignment clock ACLK<4> from the first divided clock DCLK<1>.

The clock dividing circuit 130 generates the first and second output clocks OCLK<1:2> from the first and second pre-output clocks POCLK<1:2> by receiving the selection signal SEL of a logic low level. The first and second output clocks OCLK<1:2> are generated to have frequencies ⅛ times the frequency of the write clock WCLK. The clock dividing circuit 130 generates the first output clock OCLK<1> from the first pre-output clock POCLK<1>. The clock dividing circuit 130 generates the second output clock OCLK<2> from the second pre-output clock POCLK<2>.

Figure 6:
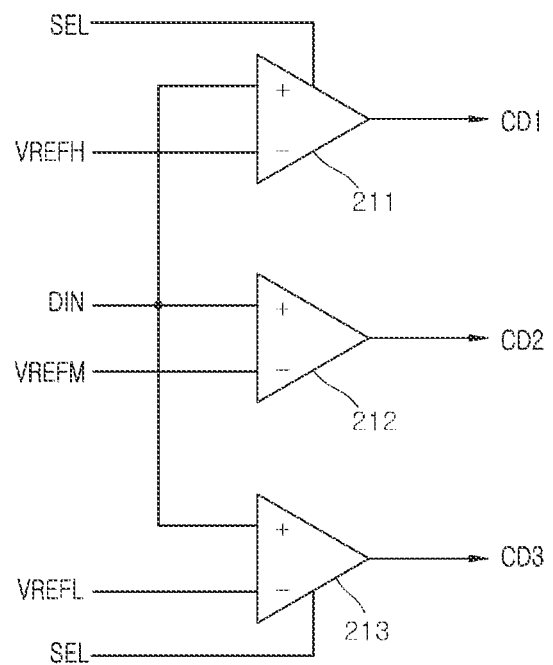
FIG. 6 is a diagram illustrating a configuration of a comparison circuit included in the electronic device illustrated in FIG. 1.

FIG. 6 is a block diagram illustrating an embodiment of the comparison circuit 210. As illustrated in FIG. 6, the comparison circuit 210 may include a first comparator 211, a second comparator 212 and a third comparator 213.

The first comparator 211 may operate when the selection signal SEL is enabled to a logic high level. The first comparator 211 may generate the first comparison signal CD1 by comparing a first reference voltage VREFH and the input data DIN when the selection signal SEL is input at a logic high level in the first operation mode.

The second comparator 212 may generate the second comparison signal CD2 by comparing a second reference voltage VREFM and the input data DIN in the first operation mode and the second operation mode.

The third comparator 213 may operate when the selection signal SEL is enabled to a logic high level. The third comparator 213 may generate the third comparison signal CD3 by comparing a third reference voltage VREFL and the input data DIN when the selection signal SEL is input at a logic high level in the first operation mode.

Levels of the input data DIN, the first reference voltage VREFH, the second reference voltage VREFM and the third reference voltage VREFL in the first operation mode will be described below with reference to FIG. 7.

In the first operation mode, a fourth level 4th LEVEL of the input data DIN means a voltage level higher than a level of the first reference voltage VREFH.

In the first operation mode, a third level 3rd LEVEL of the input data DIN means a voltage level lower than the level of the first reference voltage VREFH and higher than a level of the second reference voltage VREFM.

In the first operation mode, a second level 2nd LEVEL of the input data DIN means a voltage level lower than the level of the second reference voltage VREFM and higher than a level of the third reference voltage VREFL.

In the first operation mode, a first level 1st LEVEL of the input data DIN means a voltage level lower than the level of the third reference voltage VREFL.

The first reference voltage VREFH is a voltage having a level between the input data DIN of the fourth level 4th LEVEL and the input data DIN of the third level 3rd LEVEL.

The second reference voltage VREFM is a voltage having a level between the input data DIN of the third level 3rd LEVEL and the input data DIN of the second level 2nd LEVEL.

The third reference voltage VREFL is a voltage having a level between the input data DIN of the second level 2nd LEVEL and the input data DIN of the first level 1st LEVEL.

Levels of the input data DIN and the second reference voltage VREFM in the second operation mode will be described below with reference to FIG. 8.

In the second operation mode, a fourth level 4th LEVEL of the input data DIN means a voltage level higher than the level of the second reference voltage VREFM. The fourth level 4th LEVEL of the input data DIN means a case where the input data DIN is a logic high level. The fourth level 4th LEVEL of the input data DIN means the same voltage level as the fourth level 4th LEVEL of the input data DIN described above with reference to FIG. 7.

In the second operation mode, a first level 1st LEVEL of the input data DIN means a voltage level lower than the level of the second reference voltage VREFM. The first level 1st LEVEL of the input data DIN means a case where the input data DIN is a logic low level. The first level 1st LEVEL of the input data DIN means the same voltage level as the first level 1st LEVEL of the input data DIN described above with reference to FIG. 7.

The second reference voltage VREFM is a voltage having a level between the input data DIN of the fourth level 4th LEVEL and the input data DIN of the first level 1st LEVEL.

FIG. 9 is a diagram illustrating an embodiment of the sampling circuit 220. As illustrated in FIG. 9, the sampling circuit 220 may include a first driver 221, a second driver 222 and a third driver 223.

The first driver 221 may operate when the selection signal SEL is enabled to a logic high level. When the selection signal SEL is input at a logic high level in the first operation mode, the first driver 221 may generate the first sampling data CSI1<1:4> from the first comparison signal CD1 in synchronization with the first to fourth sampling clocks SCLK<1:4>. The first bit CSI1<1> of the first sampling data CSI1<1:4> is generated from the first comparison signal CD1 in synchronization with the first sampling clock SCLK<1>, the second bit CSI1<2> of the first sampling data CSI1<1:4> is generated from the first comparison signal CD1 in synchronization with the second sampling clock SCLK<2>, the third bit CSI1<3> of the first sampling data CSI1<1:4> is generated from the first comparison signal CD1 in synchronization with the third sampling clock SCLK<3>, and the fourth bit CSI1<4> of the first sampling data CSI1<1:4> is generated from the first comparison signal CD1 in synchronization with the fourth sampling clock SCLK<4>. Although the first driver 221 is illustrated as one circuit, the first driver 221 may be implemented by four circuits in correspondence to the number of bits of the first to fourth sampling clocks SCLK<1:4>.

The second driver 222 may generate the second sampling data CSI2<1:4> from the second comparison signal CD2 in synchronization with the first to fourth sampling clocks SCLK<1:4> in the first operation mode and the second operation mode. The first bit CSI2<1> of the second sampling data CSI2<1:4> is generated from the second comparison signal CD2 in synchronization with the first sampling clock SCLK<1>, the second bit CSI2<2> of the second sampling data CSI2<1:4> is generated from the second comparison signal CD2 in synchronization with the second sampling clock SCLK<2>, the third bit CSI2<3> of the second sampling data CSI2<1:4> is generated from the second comparison signal CD2 in synchronization with the third sampling clock SCLK<3>, and the fourth bit CSI2<4> of the second sampling data CSI2<1:4> is generated from the second comparison signal CD2 in synchronization with the fourth sampling clock SCLK<4>. Although the second driver 222 is illustrated as one circuit, the second driver 222 may be implemented by four circuits in correspondence to the number of bits of the first to fourth sampling clocks SCLK<1:4>.

The third driver 223 may operate when the selection signal SEL is enabled to a logic high level. When the selection signal SEL is input at a logic high level in the first operation mode, the third driver 223 may generate the third sampling data CSI3<1:4> from the third comparison signal CD3 in synchronization with the first to fourth sampling clocks SCLK<1:4>. The first bit CSI3<1> of the third sampling data CSI3<1:4> is generated from the third comparison signal CD3 in synchronization with the first sampling clock SCLK<1>, the second bit CSI3<2> of the third sampling data CSI3<1:4> is generated from the third comparison signal CD3 in synchronization with the second sampling clock SCLK<2>, the third bit CSI3<3> of the third sampling data CSI3<1:4> is generated from the third comparison signal CD3 in synchronization with the third sampling clock SCLK<3>, and the fourth bit CSI3<4> of the third sampling data CSI3<1:4> is generated from the third comparison signal CD3 in synchronization with the fourth sampling clock SCLK<4>. Although the third driver 223 is illustrated as one circuit, the third driver 223 may be implemented by four circuits in correspondence to the number of bits of the first to fourth sampling clocks SCLK<1:4>.

Figure 10:
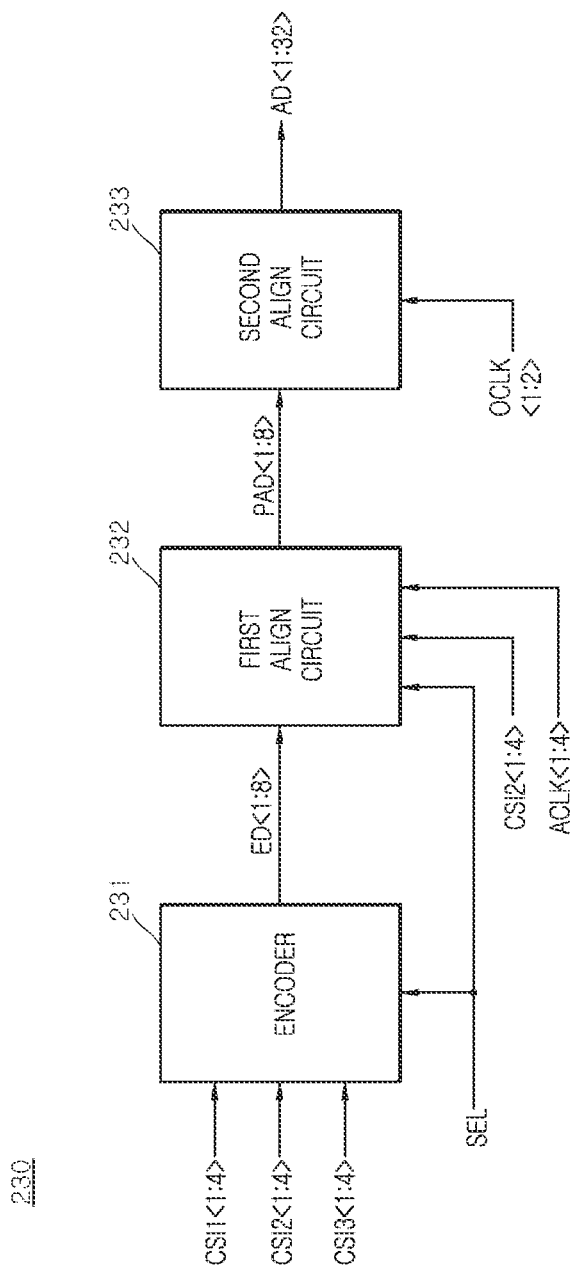
FIG. 10 is a block diagram illustrating a configuration of an alignment circuit included in the electronic device illustrated in FIG. 1.

FIG. 10 is a block diagram illustrating an embodiment of the alignment circuit 230. As illustrated in FIG. 10, the alignment circuit 230 may include an encoder 231, a first alignment circuit 232 and a second alignment circuit 233.

The encoder 231 may generate first to eighth encoding data ED<1:8> by encoding the first sampling data CSI1<1:4>, the second sampling data CSI2<1:4> and the third sampling data CSI3<1:4> in the first operation mode. When the selection signal SEL is input at a logic high level in the first operation mode, the encoder 231 may generate the first and second encoding data ED<1:2> by encoding the first bit CSI1<1> of the first sampling data CSI1<1:4>, the first bit CSI2<1> of the second sampling data CSI2<1:4> and the first bit CSI3<1> of the third sampling data CSI3<1:4>. When the selection signal SEL is input at a logic high level in the first operation mode, the encoder 231 may generate the third and fourth encoding data ED<3:4> by encoding the second bit CSI1<2> of the first sampling data CSI1<1:4>, the second bit CSI2<2> of the second sampling data CSI2<1:4> and the second bit CSI3<2> of the third sampling data CSI3<1:4>. When the selection signal SEL is input at a logic high level in the first operation mode, the encoder 231 may generate the fifth and sixth encoding data ED<5:6> by encoding the third bit CSI1<3> of the first sampling data CSI1<1:4>, the third bit CSI2<3> of the second sampling data CSI2<1:4> and the third bit CSI3<3> of the third sampling data CSI3<1:4>. When the selection signal SEL is input at a logic high level in the first operation mode, the encoder 231 may generate the seventh and eighth encoding data ED<7:8> by encoding the fourth bit CSI1<4> of the first sampling data CSI1<1:4>, the fourth bit CSI2<4> of the second sampling data CSI2<1:4> and the fourth bit CSI3<4> of the third sampling data CSI3<1:4>. The operation in which the encoder 231 generates the first to eighth encoding data ED<1:8> by encoding the first sampling data CSI1<1:4>, the second sampling data CSI2<1:4> and the third sampling data CSI3<1:4> will be described later with reference to FIG. 11.

The first alignment circuit 232 may generate first to eighth pre-alignment data PAD<1:8> by aligning the first to eighth encoding data ED<1:8> in the first operation mode. When the selection signal SEL is input at a logic high level in the first operation mode, the first alignment circuit 232 may generate the first to eighth pre-alignment data PAD<1:8> by aligning the first to eighth encoding data ED<1:8> in synchronization with the first to fourth alignment clocks ACLK<1:4>. In the second operation mode, the first alignment circuit 232 may generate the first to eighth pre-alignment data PAD<1:8> by aligning the second sampling data CSI2<1:4>. When the selection signal SEL is input at a logic low level in the second operation mode, the first alignment circuit 232 may generate the first to eighth pre-alignment data PAD<1:8> by aligning the second sampling data CSI2<1:4> in synchronization with the first to fourth alignment clocks ACLK<1:4>. The first alignment circuit 232 may include a plurality of latch circuits, and may perform an operation of latching the first to eighth encoding data ED<1:8> and realigning the latched first to eighth encoding data ED<1:8>. The operation in which the first alignment circuit 232 generates the first to eighth pre-alignment data PAD<1:8> in the first operation mode and the second operation mode will be described later with reference to FIGS. 12 to 17.

The second alignment circuit 233 may generate the alignment data AD by aligning the first to eighth pre-alignment data PAD<1:8> in synchronization with the first and second output clocks OCLK<1:2> in the first operation mode and the second operation mode. The second alignment circuit 233 may include a plurality of latch circuits, and may perform an operation of latching the first to eighth pre-alignment data PAD<1:8> and realigning the latched first to eighth pre-alignment data PAD<1:8>. The operation in which the second alignment circuit 233 generates the alignment data AD in the first operation mode and the second operation mode will be described later with reference to FIGS. 12 to 17.

The operation of the encoder 231 in the first operation mode will be described below with reference to FIG. 11, by taking, as an example, logic levels of the first and second encoding data ED<1:2> generated by the encoder 231 according to the first bit CSI1<1> of the first sampling data CSI1<1:4>, the first bit CSI2<1> of the second sampling data CSI2<1:4> and the first bit CSI3<1> of the third sampling data CSI3<1:4>.

When the first bit CSI1<1> of the first sampling data CSI1<1:4> is a logic high level (i.e., H), the first bit CSI2<1> of the second sampling data CSI2<1:4> is a logic high level and the first bit CSI3<1> of the third sampling data CSI3<1:4> is a logic high level, the encoder 231 may generate the first encoding data ED<1> of a logic high level and the second encoding data ED<2> of a logic high level.

When the first bit CSI1<1> of the first sampling data CSI1<1:4> is a logic low level (i.e., L), the first bit CSI2<1> of the second sampling data CSI2<1:4> is a logic high level and the first bit CSI3<1> of the third sampling data CSI3<1:4> is a logic high level, the encoder 231 may generate the first encoding data ED<1> of a logic high level and the second encoding data ED<2> of a logic low level.

When the first bit CSI1<1> of the first sampling data CSI1<1:4> is a logic low level, the first bit CSI2<1> of the second sampling data CSI2<1:4> is a logic low level and the first bit CSI3<1> of the third sampling data CSI3<1:4> is a logic high level, the encoder 231 may generate the first encoding data ED<1> of a logic low level and the second encoding data ED<2> of a logic high level.

When the first bit CSI1<1> of the first sampling data CSI1<1:4> is a logic low level, the first bit CSI2<1> of the second sampling data CSI2<1:4> is a logic low level and the first bit CSI3<1> of the third sampling data CSI3<1:4> is a logic low level, the encoder 231 may generate the first encoding data ED<1> of a logic low level and the second encoding data ED<2> of a logic low level.

The operation in which the encoder 231 generates the third to eighth encoding data ED<3:8> is the same as the operation in which the encoder 231 generates the first and second encoding data ED<1:2>, and thus, a description thereof will be omitted.

Figure 12:
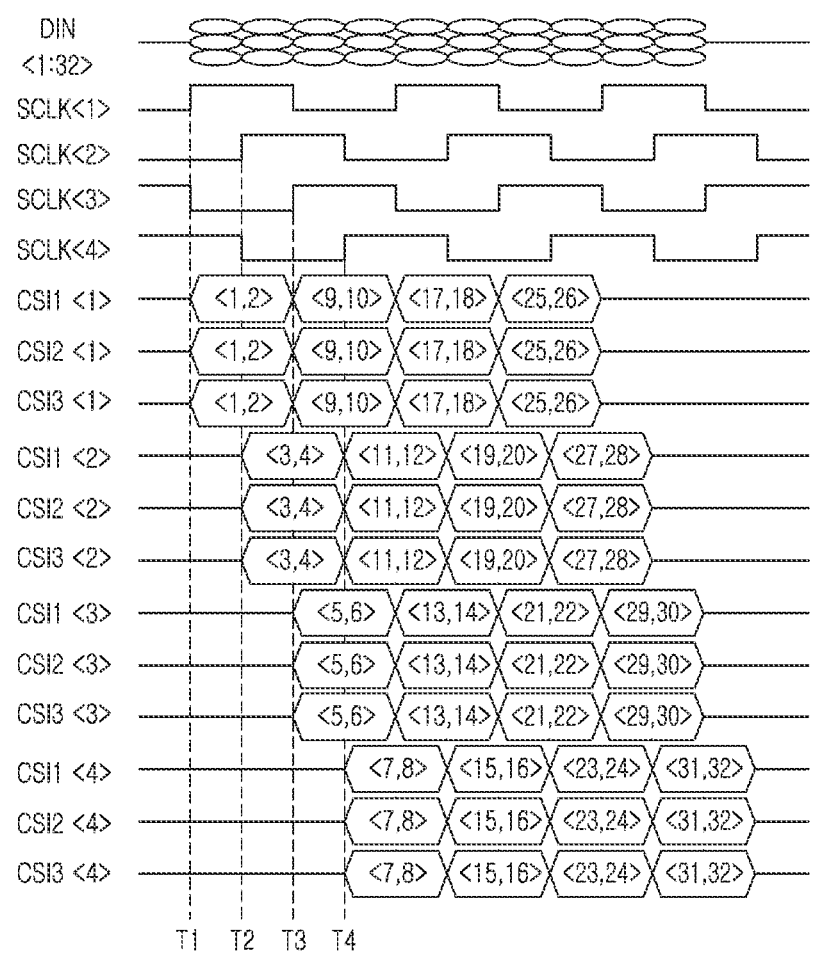
FIGS. 12, 13, 14, 15, 16, and 17 are timing diagrams to assist in the explanation of the operation of the electronic device in accordance with the embodiment of the present disclosure.

A data alignment operation in the first operation mode of the electronic device 10 in accordance with the embodiment of the present disclosure will be described below with reference to FIG. 12, as an operation in which the first sampling data CSI1<1:4>, the second sampling data CSI2<1:4> and the third sampling data CSI3<1:4> are generated from 32-bit input data DIN<1:32>.

Figure 7:
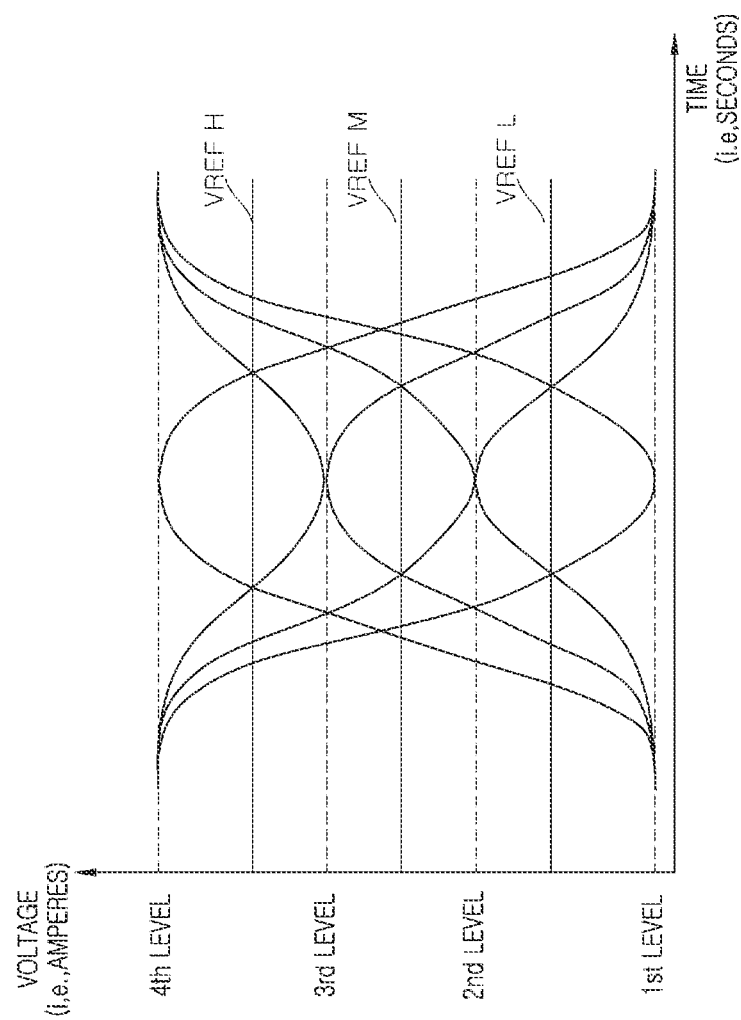
FIG. 7 is a graph to assist in the explanation of levels of input data and reference voltages in a first operation mode in accordance with the embodiment of the present disclosure.

Prior to description, in the first operation mode, the 32-bits of the input data DIN<1:32> are sequentially input each with any one level of the first to fourth levels as illustrated in FIG. 7. The 32-bit input data DIN<1:32> is implemented as first to sixteenth pulses are sequentially input, and is implemented to include 2-bit input data DIN per pulse.

The control circuit 110 generates the selection signal SEL which is enabled to a logic high level to enter the first operation mode.

The clock dividing circuit 130 generates the first to fourth sampling clocks SCLK<1:4> by dividing by 2 the frequencies of the write clock WCLK and the inverted write clock WCLKB by the selection signal SEL of a logic high level.

At a time point T1, the first comparator 211 of the comparison circuit 210 operates by receiving the selection signal SEL of a logic high level, and generates the first comparison signal CD1 by comparing the first reference voltage VREFH and the first pulse of the input data DIN. The second comparator 212 of the comparison circuit 210 generates the second comparison signal CD2 by comparing the second reference voltage VREFM and the first pulse of the input data DIN. The third comparator 213 of the comparison circuit 210 operates by receiving the selection signal SEL of a logic high level, and generates the third comparison signal CD3 by comparing the third reference voltage VREFL and the first pulse of the input data DIN. The first pulse included in the input data DIN includes first and second input data DIN<1:2>.

The first driver 221 of the sampling circuit 220 operates by receiving the selection signal SEL of a logic high level, and generates the first bit CSI1<1> of the first sampling data CSI1<1:4> from the first comparison signal CD1 in synchronization with the first sampling clock SCLK<1>. The second driver 222 of the sampling circuit 220 generates the first bit CSI2<1> of the second sampling data CSI2<1:4> from the second comparison signal CD2 in synchronization with the first sampling clock SCLK<1>. The third driver 223 of the sampling circuit 220 operates by receiving the selection signal SEL of a logic high level, and generates the first bit CSI3<1> of the third sampling data CSI3<1:4> from the third comparison signal CD3 in synchronization with the first sampling clock SCLK<1>. The first bit CSI1<1> of the first sampling data CSI1<1:4>, the first bit CSI2<1> of the second sampling data CSI2<1:4> and the first bit CSI3<1> of the third sampling data CSI3<1:4> are generated from the first pulse included in the input data DIN.

At a time point T2, the first comparator 211 of the comparison circuit 210 operates by receiving the selection signal SEL of a logic high level, and generates the first comparison signal CD1 by comparing the first reference voltage VREFH and the second pulse of the input data DIN. The second comparator 212 of the comparison circuit 210 generates the second comparison signal CD2 by comparing the second reference voltage VREFM and the second pulse of the input data DIN. The third comparator 213 of the comparison circuit 210 operates by receiving the selection signal SEL of a logic high level, and generates the third comparison signal CD3 by comparing the third reference voltage VREFL and the second pulse of the input data DIN. The second pulse included in the input data DIN includes third and fourth input data DIN<3:4>.

The first driver 221 of the sampling circuit 220 operates by receiving the selection signal SEL of a logic high level, and generates the second bit CSI1<2> of the first sampling data CSI1<1:4> from the first comparison signal CD1 in synchronization with the second sampling clock SCLK<2>.

The second driver 222 of the sampling circuit 220 generates the second bit CSI2<2> of the second sampling data CSI2<1:4> from the second comparison signal CD2 in synchronization with the second sampling clock SCLK<2>. The third driver 223 of the sampling circuit 220 operates by receiving the selection signal SEL of a logic high level, and generates the second bit CSI3<2> of the third sampling data CSI3<1:4> from the third comparison signal CD3 in synchronization with the second sampling clock SCLK<2>. The second bit CSI1<2> of the first sampling data CSI1<1:4>, the second bit CSI2<2> of the second sampling data CSI2<1:4> and the second bit CSI3<2> of the third sampling data CSI3<1:4> are generated from the second pulse included in the input data DIN.

At a time point T3, the first comparator 211 of the comparison circuit 210 operates by receiving the selection signal SEL of a logic high level, and generates the first comparison signal CD1 by comparing the first reference voltage VREFH and the third pulse of the input data DIN. The second comparator 212 of the comparison circuit 210 generates the second comparison signal CD2 by comparing the second reference voltage VREFM and the third pulse of the input data DIN. The third comparator 213 of the comparison circuit 210 operates by receiving the selection signal SEL of a logic high level, and generates the third comparison signal CD3 by comparing the third reference voltage VREFL and the third pulse of the input data DIN. The third pulse included in the input data DIN includes fifth and sixth input data DIN<5:6>.

The first driver 221 of the sampling circuit 220 operates by receiving the selection signal SEL of a logic high level, and generates the third bit CSI1<3> of the first sampling data CSI1<1:4> from the first comparison signal CD1 in synchronization with the third sampling clock SCLK<3>. The second driver 222 of the sampling circuit 220 generates the third bit CSI2<3> of the second sampling data CSI2<1:4> from the second comparison signal CD2 in synchronization with the third sampling clock SCLK<3>. The third driver 223 of the sampling circuit 220 operates by receiving the selection signal SEL of a logic high level, and generates the third bit CSI3<3> of the third sampling data CSI3<1:4> from the third comparison signal CD3 in synchronization with the third sampling clock SCLK<3>. The third bit CSI1<3> of the first sampling data CSI1<1:4>, the third bit CSI2<3> of the second sampling data CSI2<1:4> and the third bit CSI3<3> of the third sampling data CSI3<1:4> are generated from the third pulse included in the input data DIN.

At a time point T4, the first comparator 211 of the comparison circuit 210 operates by receiving the selection signal SEL of a logic high level, and generates the first comparison signal CD1 by comparing the first reference voltage VREFH and the fourth pulse of the input data DIN. The second comparator 212 of the comparison circuit 210 generates the second comparison signal CD2 by comparing the second reference voltage VREFM and the fourth pulse of the input data DIN. The third comparator 213 of the comparison circuit 210 operates by receiving the selection signal SEL of a logic high level, and generates the third comparison signal CD3 by comparing the third reference voltage VREFL and the fourth pulse of the input data DIN. The fourth pulse included in the input data DIN includes seventh and eighth input data DIN<7:8>.

The first driver 221 of the sampling circuit 220 operates by receiving the selection signal SEL of a logic high level, and generates the fourth bit CSI1<4> of the first sampling data CSI1<1:4> from the first comparison signal CD1 in synchronization with the fourth sampling clock SCLK<4>. The second driver 222 of the sampling circuit 220 generates the fourth bit CSI2<4> of the second sampling data CSI2<1:4> from the second comparison signal CD2 in synchronization with the fourth sampling clock SCLK<4>. The third driver 223 of the sampling circuit 220 operates by receiving the selection signal SEL of a logic high level, and generates the fourth bit CSI3<4> of the third sampling data CSI3<1:4> from the third comparison signal CD3 in synchronization with the fourth sampling clock SCLK<4>. The fourth bit CSI1<4> of the first sampling data CSI1<1:4>, the fourth bit CSI2<4> of the second sampling data CSI2<1:4> and the fourth bit CSI3<4> of the third sampling data CSI3<1:4> are generated from the fourth pulse included in the input data DIN.

Bits of the first sampling data CSI1<1:4>, the second sampling data CSI2<1:4> and the third sampling data CSI3 1:4> generated from the fifth to sixteenth pulses of the input data DIN are generated in the same manner as those generated in the operation from the time point T1 to the time point T4, and thus, detailed description thereof will be omitted.

Figure 13:
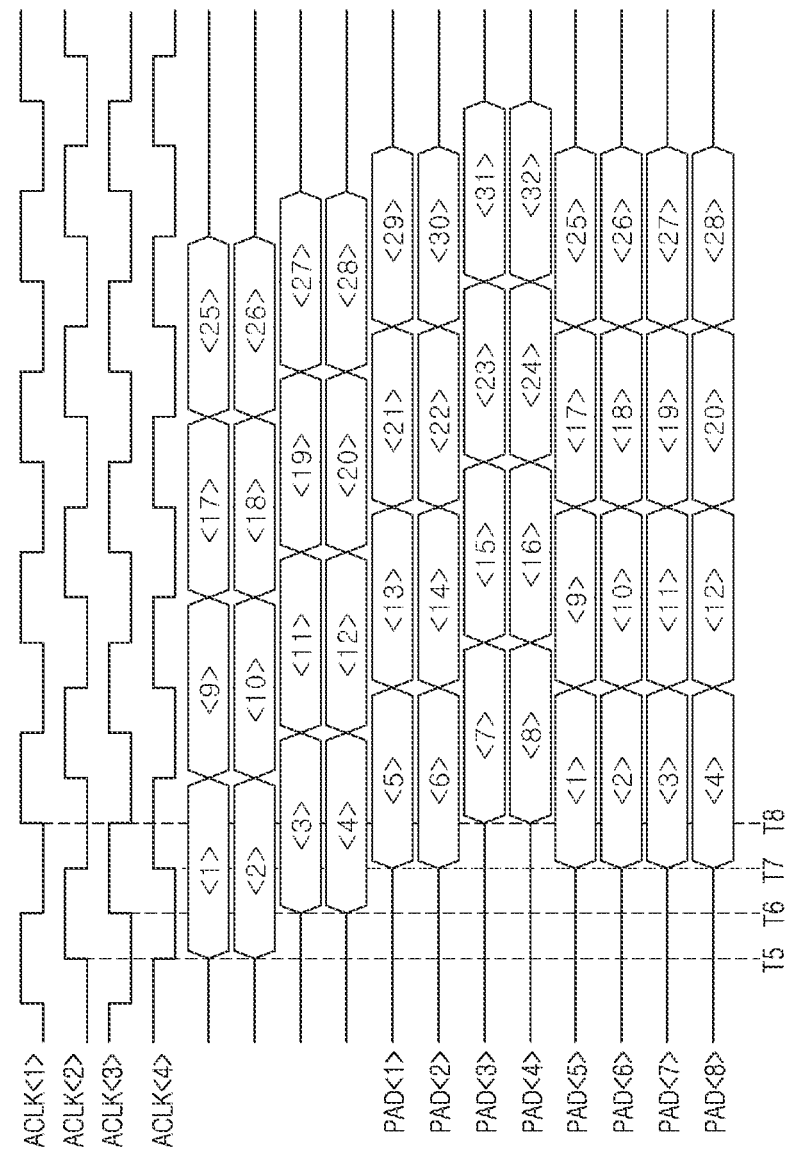

A data alignment operation in the first operation mode of the electronic device 10 in accordance with the embodiment of the present disclosure will be described below with reference to FIG. 13, as an operation in which the first to eighth pre-alignment data PAD<1:8> are generated from the first sampling data CSI1<1:4>, the second sampling data CSI2<1:4> and the third sampling data CSI3<1:4>.

The clock dividing circuit 130 generates the first to fourth alignment clocks ACLK<1:4> by dividing by 2 the frequencies of the write clock WCLK and the inverted write clock WCLKB by the selection signal SEL of a logic high level.

The encoder 231 generates the first to eighth encoding data ED<1:8> by encoding the first sampling data CSI1<1:4>, the second sampling data CSI2<1:4> and the third sampling data CSI3<1:4> by the selection signal SEL of a logic high level.

At a time point T5, the first alignment circuit 232 aligns the first and second encoding data ED<1:2> in synchronization with the second alignment clock ACLK<2>. The aligned first and second encoding data ED<1:2> are generated from the first pulse of the input data DIN.

At a time point T6, the first alignment circuit 232 aligns the third and fourth encoding data ED<3:4> in synchronization with the third alignment clock ACLK<3>. The aligned third and fourth encoding data ED<3:4> are generated from the second pulse of the input data DIN.

At a time point T7, the first alignment circuit 232 aligns the fifth and sixth encoding data ED<5:6> in synchronization with the fourth alignment clock ACLK<4>, and generates the first and second pre-alignment data PAD<1:2> from the aligned fifth and sixth encoding data ED<5:6>. The aligned fifth and sixth encoding data ED<5:6> are generated from the third pulse of the input data DIN. The first and second pre-alignment data PAD<1:2>are generated from the third pulse of the input data DIN.

The first alignment circuit 232 generates the fifth and sixth pre-alignment data PAD<5:6> from the first and second encoding data ED<1:2> aligned at the time point T5, in synchronization with the fourth alignment clock ACLK<4>. The fifth and sixth pre-alignment data PAD<5:6> are generated from the first pulse of the input data DIN. The first alignment circuit 232 generates the seventh and eighth pre-alignment data PAD<7:8> from the third and fourth encoding data ED<3:4> aligned at the time point T6, in synchronization with the fourth alignment clock ACLK<4>.

The seventh and eighth pre-alignment data PAD<7:8> are generated from the second pulse of the input data DIN.

At a time point T8, the first alignment circuit 232 aligns the seventh and eighth encoding data ED<7:8> in synchronization with the first alignment clock ACLK<1>, and generates the third and fourth pre-alignment data PAD<3:4> from the aligned seventh and eighth encoding data ED<7:8>. The aligned seventh and eighth encoding data ED<7:8> are generated from the fourth pulse of the input data DIN. The third and fourth pre-alignment data PAD<3:4> are generated from the fourth pulse of the input data DIN.

The first to eighth pre-alignment data PAD<1:8> generated from the fifth to sixteenth pulses of the input data DIN are generated in the same manner as those generated in the operation from the time point T5 to the time point T8, and thus, detailed description thereof will be omitted.

It has been described that the first alignment circuit 232 aligns the first to eighth encoding data ED<1:8> encoded from the first sampling data CSI1<1:4>, the second sampling data CSI2<1:4> and the third sampling data CSI3<1:4>, in synchronization with the first to fourth alignment clocks ACLK<1:4>, but this is nothing but a mere example. In another embodiment, the first alignment circuit 232 may be implemented in such a way to generate the first to eighth pre-alignment data PAD<1:8> by first synchronizing the first sampling data CSI1<1:4>, the second sampling data CSI2<1:4> and the third sampling data CSI3<1:4> with the first to fourth alignment clocks ACLK<1:4> and generate the first to eighth encoding data ED<1:8> from the generated first to eighth pre-alignment data PAD<1:8>.

Figure 14:
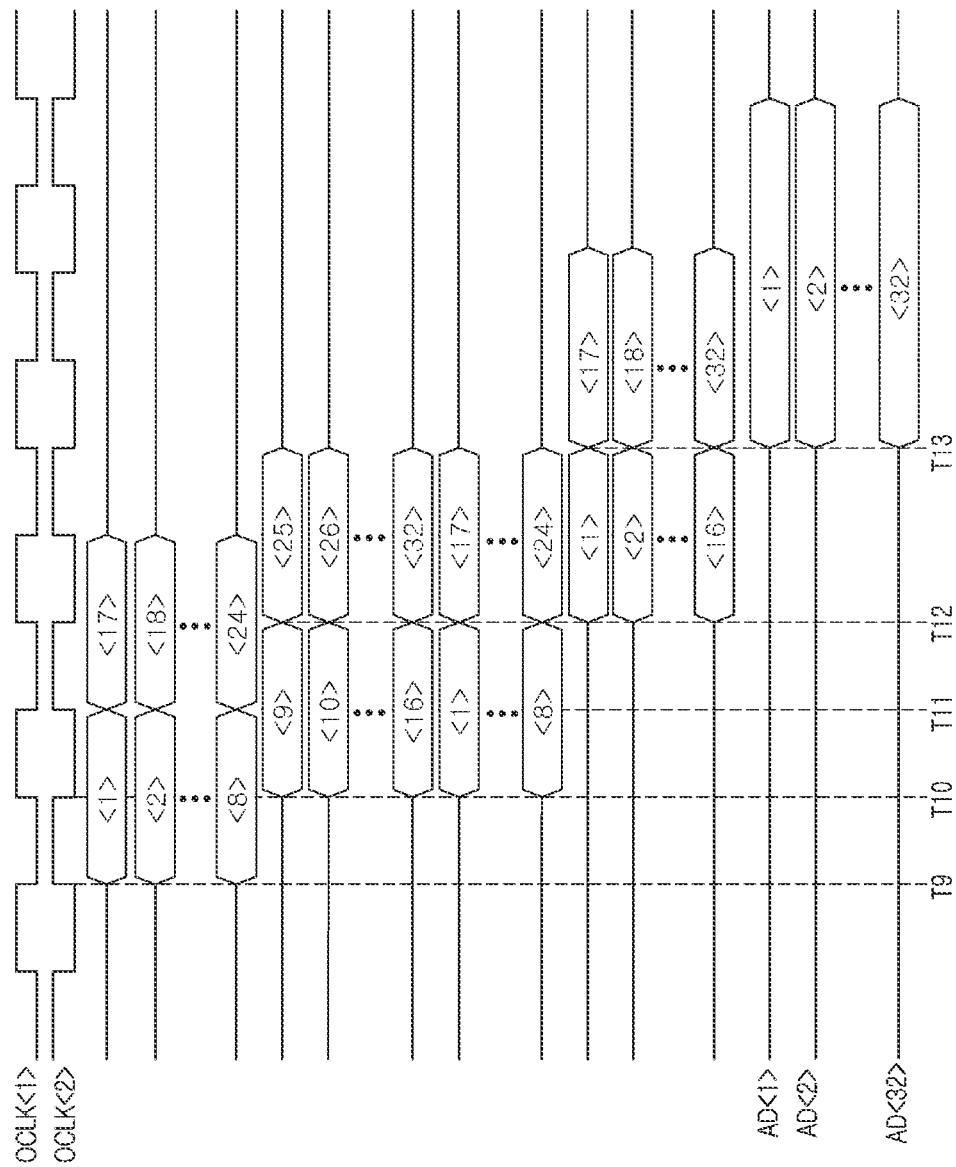

A data alignment operation in the first operation mode of the electronic device 10 in accordance with the embodiment of the present disclosure will be described below with reference to FIG. 14, as an operation in which 32-bit alignment data AD<1:32> is generated from the first to eighth pre-alignment data PAD<1:8>.

The clock dividing circuit 130 generates the first and second output clocks OCLK<1:2> by dividing by 4 the frequencies of the write clock WCLK and the inverted write clock WCLKB by the selection signal SEL of a logic high level.

At a time point T9, the second alignment circuit 233 aligns the first to eighth pre-alignment data PAD<1:8> in synchronization with the second output clock OCLK<2>. The aligned first to eighth pre-alignment data PAD<1:8> are generated from the first to fourth pulses of the input data DIN.

At a time point T10, the second alignment circuit 233 aligns the first to eighth pre-alignment data PAD<1:8> in synchronization with the first output clock OCLK<1>. The aligned first to eighth pre-alignment data PAD<1:8> are generated from the fifth to eighth pulses of the input data DIN.

The second alignment circuit 233 realigns the first to eighth pre-alignment data PAD<1:8> aligned at the time point T9, in synchronization with the first output clock OCLK<1>. The aligned first to eighth pre-alignment data PAD<1:8> are generated from the first to fourth pulses of the input data DIN.

At a time point T11, the second alignment circuit 233 aligns the first to eighth pre-alignment data PAD<1:8> in synchronization with the second output clock OCLK<2>. The aligned first to eighth pre-alignment data PAD<1:8> are generated from the ninth to twelfth pulses of the input data DIN.

At a time point T12, the second alignment circuit 233 aligns the first to eighth pre-alignment data PAD<1:8> in synchronization with the first output clock OCLK<1>. The aligned first to eighth pre-alignment data PAD<1:8> are generated from the thirteenth to sixteenth pulses of the input data DIN.

The second alignment circuit 233 realigns the first to eighth pre-alignment data PAD<1:8> aligned at the time point T11, in synchronization with the first output clock OCLK<1>. The aligned first to eighth pre-alignment data PAD<1:8> are generated from the ninth to twelfth pulses of the input data DIN.

The second alignment circuit 233 realigns the two first to eighth pre-alignment data PAD<1:8> aligned at the time point T10, in synchronization with the first output clock OCLK<1>. The aligned two first to eighth pre-alignment data PAD<1:8> are generated from the first to eighth pulses of the input data DIN.

At a time point T13, the second alignment circuit 233 realigns the two first to eighth pre-alignment data PAD<1:8> aligned at the time point T12, in synchronization with the first output clock OCLK<1>. The aligned two first to eighth pre-alignment data PAD<1:8> are generated from the ninth to sixteenth pulses of the input data DIN.

The second alignment circuit 233 generates first to sixteenth alignment data AD<1:16> by realigning the two first to eighth pre-alignment data PAD<1:8> aligned at the time point T12, in synchronization with the first output clock OCLK<1>. The first to sixteenth alignment data AD<1:16> are generated from the first to eighth pulses of the input data DIN.

The second alignment circuit 233 generates seventeenth to thirty-second alignment data AD<17:32> by realigning the two first to eighth pre-alignment data PAD<1:8> aligned at the time point T13, in synchronization with the first output clock OCLK<1>. The seventeenth to thirty-second alignment data AD<17:32> are generated from the ninth to sixteenth pulses of the input data DIN.

Figure 15:
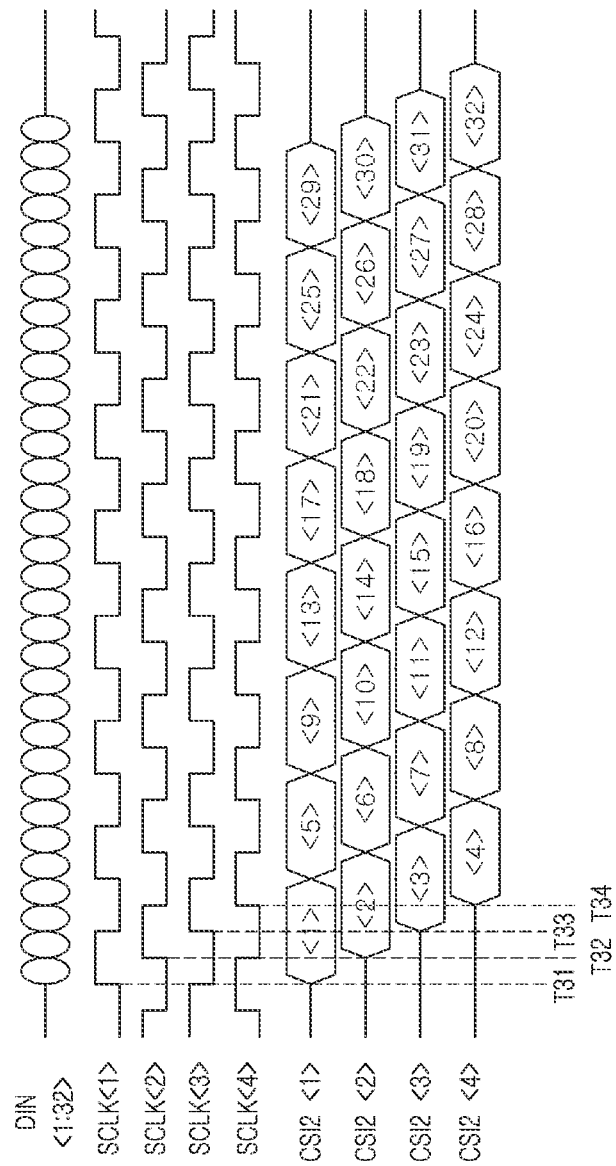

A data alignment operation in the second operation mode of the electronic device 10 in accordance with the embodiment of the present disclosure will be described below with reference to FIG. 15, as an operation in which the second sampling data CSI2<1:4> is generated from 32-bit input data DIN<1:32>.

Figure 8:
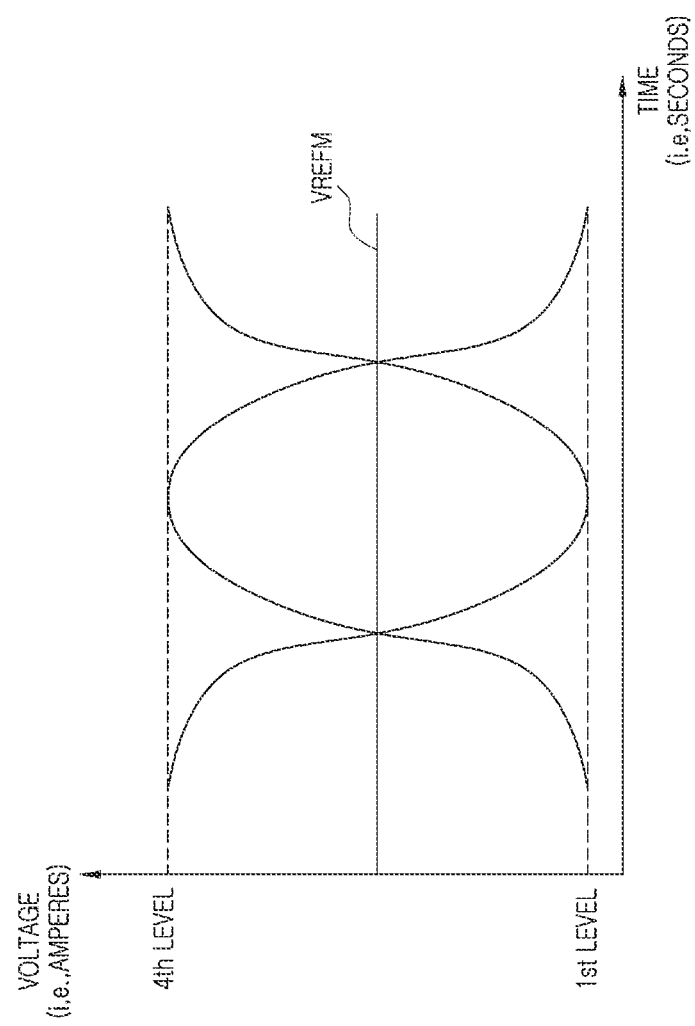
FIG. 8 is a graph to assist in the explanation of levels of input data and reference voltages in a second operation mode in accordance with the embodiment of the present disclosure.

Prior to description, in the second operation mode, the 32-bits of the input data DIN<1:32> may be sequentially input each with any one level of the first level and the fourth level as illustrated in FIG. 8. The 32-bit input data DIN<1:32> may be implemented as first to thirty-second pulses are sequentially input, and may be implemented to include 1-bit input data DIN per pulse.

The control circuit 110 generates the selection signal SEL which is disabled to a logic low level to enter the second operation mode.

The clock dividing circuit 130 generates the first to fourth sampling clocks SCLK<1:4> by dividing by 2 the frequencies of the write clock WCLK and the inverted write clock WCLKB by the selection signal SEL of a logic low level.

The second comparator 212 of the comparison circuit 210 generates the second comparison signal CD2 by comparing the second reference voltage VREFM and first to thirty-second input data DIN<1:32>.

At a time point T31, the second driver 222 of the sampling circuit 220 generates the first bit CSI2<1> of the second sampling data CSI2<1:4> from the second comparison signal CD2 in synchronization with the first sampling clock SCLK<1>. The first bit CSI2<1> of the second sampling data CSI2<1:4> is generated from the first pulse of the input data DIN.

At a time point T32, the second driver 222 of the sampling circuit 220 generates the second bit CSI2<2> of the second sampling data CSI2<1:4> from the second comparison signal CD2 in synchronization with the second sampling clock SCLK<2>. The second bit CSI2<2> of the second sampling data CSI2<1:4> is generated from the second pulse of the input data DIN.

At a time point T33, the second driver 222 of the sampling circuit 220 generates the third bit CSI2<3> of the second sampling data CSI2<1:4> from the second comparison signal CD2 in synchronization with the third sampling clock SCLK<3>. The third bit CSI2<3> of the second sampling data CSI2<1:4> is generated from the third pulse of the input data DIN.

At a time point 134, the second driver 222 of the sampling circuit 220 generates the fourth bit CSI2<4> of the second sampling data CSI2<1:4> from the second comparison signal CD2 in synchronization with the fourth sampling clock SCLK<4>. The fourth bit CSI2<4> of the second sampling data CSI2<1:4> is generated from the fourth pulse of the input data DIN.

The bits of the second sampling data CSI2<1:4> generated from the fifth to thirty-second pulses of the input data DIN are generated in the same manner as those generated in the operation from the time point T31 to the time point T34, and thus, detailed description thereof will be omitted.

Figure 16:
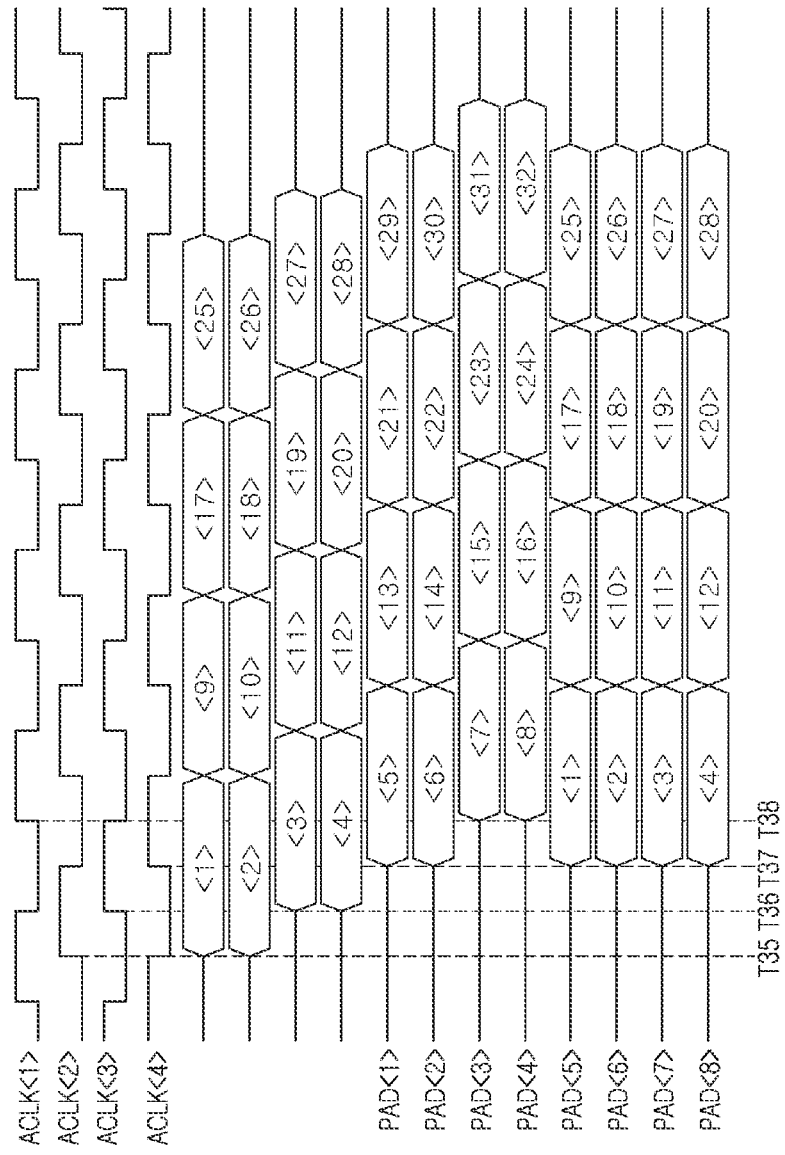

A data alignment operation in the second operation mode of the electronic device 10 in accordance with the embodiment of the present disclosure will be described below with reference to FIG. 16, as an operation in which the first to eighth pre-alignment data PAD<1:8> are generated from the second sampling data CSI2<1:4>.

The clock dividing circuit 130 generates the first to fourth alignment clocks ACLK<1:4> by dividing by 4 the frequencies of the write clock WCLK and the inverted write clock WCLKB by the selection signal SEL of a logic low level.

At a time point T35, the first alignment circuit 232 aligns the first and second bits CSI2<1:2> of the second sampling data CSI2<1:4> in synchronization with the second alignment clock ACLK<2>. The aligned first and second bits CSI2<1:2> of the second sampling data CSI2<1:4> are generated from the first and second pulses of the input data DIN.

At a time point T36, the first alignment circuit 232 aligns the third and fourth bits CSI2<3:4> of the second sampling data CSI2<1:4> in synchronization with the third alignment clock ACLK<3>. The aligned third and fourth bits CSI2<3:4> of the second sampling data CSI2<1:4> are generated from the third and fourth pulses of the input data DIN.

At a time point T37, the first alignment circuit 232 aligns the first and second bits CSI2<1:2> of the second sampling data CSI2<1:4> in synchronization with the fourth alignment clock ACLK<4>, and generates the first and second pre-alignment data PAD<1:2> from the aligned first and second bits CSI2<1:2> of the second sampling data CSI2<1:4>. The aligned first and second bits CSI2<1:2> of the second sampling data CSI2<1:4> are generated from the fifth and sixth pulses of the input data DIN. The first and second pre-alignment data PAD<1:2> are generated from the fifth and sixth pulses of the input data DIN.

The first alignment circuit 232 generates the fifth and sixth pre-alignment data PAD<5:6> from the first and second bits CSI2<1:2> of the second sampling data CSI2<1:4> aligned at the time point T35, in synchronization with the fourth alignment clock ACLK<4>. The fifth and sixth pre-alignment data PAD<5:6> are generated from the first and second pulses of the input data DIN. The first alignment circuit 232 generates the seventh and eighth pre-alignment data PAD<7:8> from the third and fourth bits CSI2<3:4> of the second sampling data CSI2<1:4> aligned at the time point T36, in synchronization with the fourth alignment clock ACLK<4>. The seventh and eighth pre-alignment data PAD<7:8> are generated from the third and fourth pulses of the input data DIN.

At a time point 138, the first alignment circuit 232 aligns the third and fourth bits CSI2<3:4> of the second sampling data CSI2<1:4> in synchronization with the first alignment clock ACLK<1>, and generates the third and fourth pre-alignment data PAD<3:4> from the aligned third and fourth bits CSI2<3:4> of the second sampling data CSI2<1:4>. The aligned third and fourth bits CSI2<3:4> of the second sampling data CSI2<1:4> are generated from the seventh and eighth pulses of the input data DIN. The third and fourth pre-alignment data PAD<3:4> are generated from the seventh and eighth pulses of the input data DIN.

The first to eighth pre-alignment data PAD<1:8> generated from the ninth to thirty-second pulses of the input data DIN are generated in the same manner as those generated in the operation from the time point T35 to the time point T38, and thus, detailed description thereof will be omitted.

Figure 17:
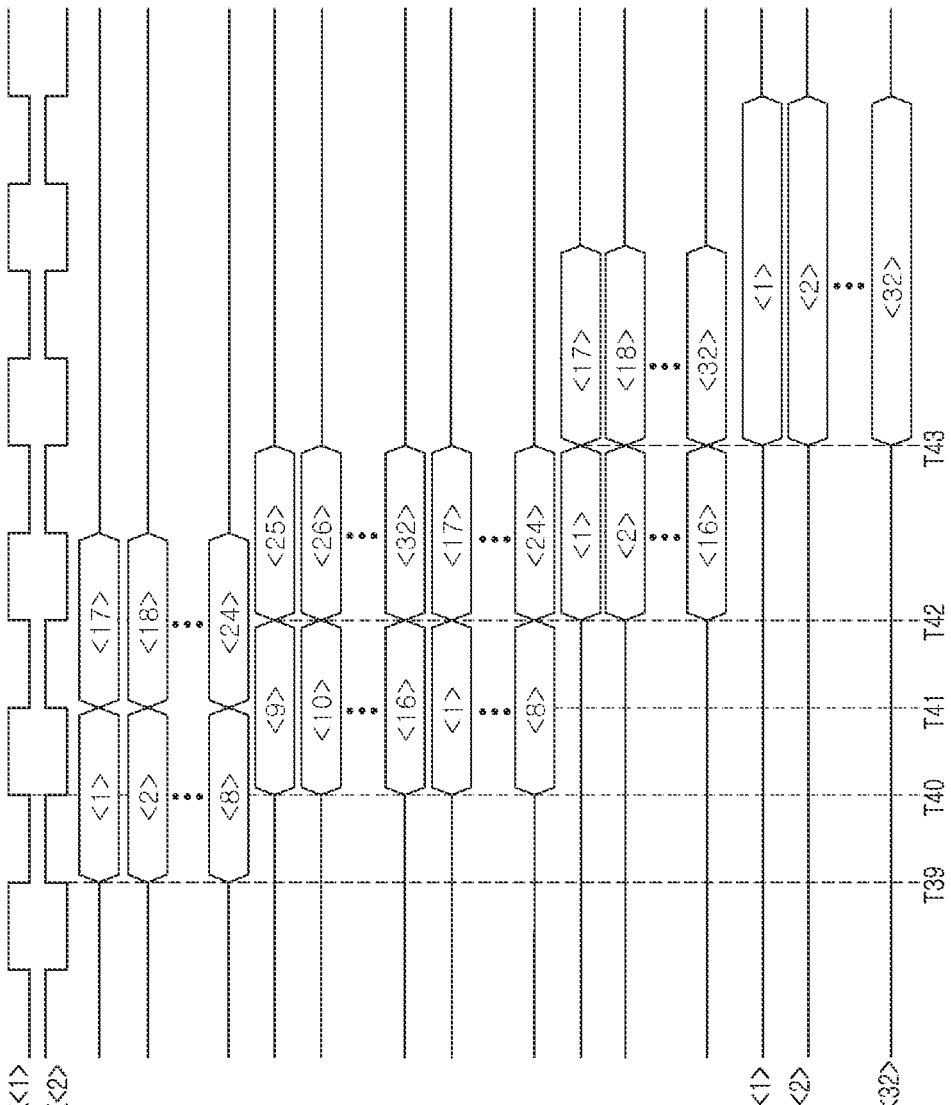

A data alignment operation in the second operation mode of the electronic device 10 in accordance with the embodiment of the present disclosure will be described below with reference to FIG. 17, as an operation in which 32-bit alignment data AD<1:32> is generated from the first to eighth pre-alignment data PAD<1:8>.

The clock dividing circuit 130 generates the first and second output clocks OCLK<1:2> by dividing by 8 the frequencies of the write clock WCLK and the inverted write clock WCLKB by the selection signal SEL of a logic low level.

At a time point T39, the second alignment circuit 233 aligns the first to eighth pre-alignment data PAD<1:8> in synchronization with the second output clock OCLK<2>. The aligned first to eighth pre-alignment data PAD<1:8> are generated from the first to eighth pulses of the input data DIN.

At a time point T40, the second alignment circuit 233 aligns the first to eighth pre-alignment data PAD<1:8> in synchronization with the first output clock OCLK<1>. The aligned first to eighth pre-alignment data PAD<1:8> are generated from the ninth to sixteenth pulses of the input data DIN.

The second alignment circuit 233 realigns the first to eighth pre-alignment data PAD<1:8> aligned at the time point T39, in synchronization with the first output clock OCLK<1>. The aligned first to eighth pre-alignment data PAD<1:8> are generated from the first to eighth pulses of the input data DIN.

At a time point T41, the second alignment circuit 233 aligns the first to eighth pre-alignment data PAD<1:8> in synchronization with the second output clock OCLK<2>. The aligned first to eighth pre-alignment data PAD<1:8> are generated from the seventeenth to twenty-fourth pulses of the input data DIN.

At a time point T42, the second alignment circuit 233 aligns the first to eighth pre-alignment data PAD<1:8> in synchronization with the first output clock OCLK<1>. The aligned first to eighth pre-alignment data PAD<1:8> are generated from the twenty-fifth to thirty-second pulses of the input data DIN.

The second alignment circuit 233 realigns the first to eighth pre-alignment data PAD<1:8> aligned at the time point T41, in synchronization with the first output clock OCLK<1>. The aligned first to eighth pre-alignment data PAD<1:8> are generated from the seventeenth to twenty-fourth pulses of the input data DIN.

The second alignment circuit 233 realigns the two first to eighth pre-alignment data PAD<1:8> aligned at the time point T40, in synchronization with the first output clock OCLK<1>. The aligned two first to eighth pre-alignment data PAD<1:8> are generated from the first to sixteenth pulses of the input data DIN.

At a time point T43, the second alignment circuit 233 realigns the two first to eighth pre-alignment data PAD<1:8> aligned at the time point T42, in synchronization with the first output clock OCLK<1>. The aligned two first to eighth pre-alignment data PAD<1:8> are generated from the seventeenth to thirty-second pulses of the input data DIN.

The second alignment circuit 233 generates first to sixteenth alignment data AD<1:16> by realigning the two first to eighth pre-alignment data PAD<1:8> aligned at the time point T42, in synchronization with the first output clock OCLK<1>. The first to sixteenth alignment data AD<1:16> are generated from the first to sixteenth pulses of the input data DIN.

The second alignment circuit 233 generates seventeenth to thirty-second alignment data AD<17:32> by realigning the two first to eighth pre-alignment data PAD<1:8> aligned at the time point T43, in synchronization with the first output clock OCLK<1>. The seventeenth to thirty-second alignment data AD<17:32> are generated from the seventeenth to thirty-second pulses of the input data DIN.

As is apparent from the above description, the electronic device 10 in accordance with the embodiment of the present disclosure may support a first operation mode in which, during a data alignment operation, a pulse amplitude of data is adjusted to four levels and 2-bit data is input/output per pulse and a second operation mode in which, during a data alignment operation, a bit of a logic high level and a bit of a logic low level in data each maintain its logic level till a time point when a next bit is input. The electronic device 10 may secure the reliability of the data alignment operation by selectively performing the first operation mode and the second operation mode in conformity with a high-speed operation and a low-speed operation during the data alignment operation.

Figure 18:
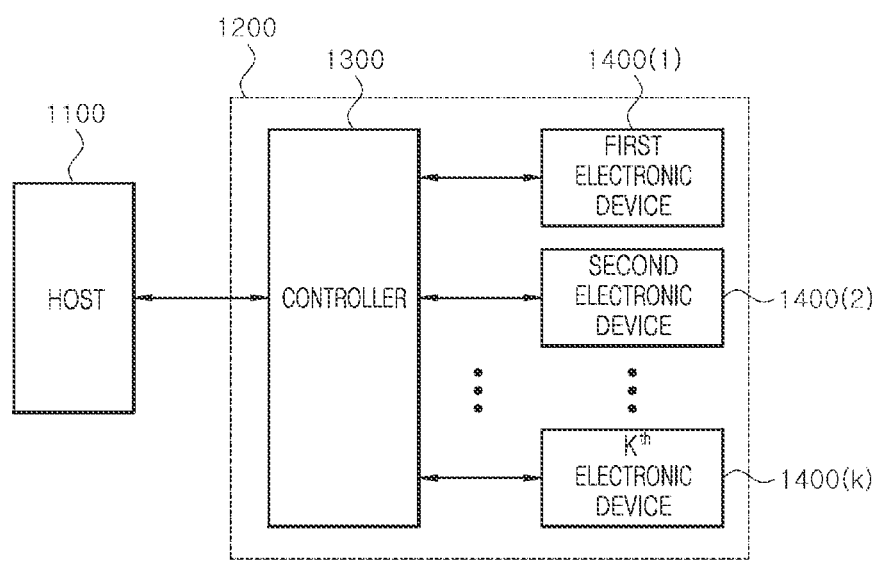
FIG. 18 is a diagram illustrating a configuration of an electronic system in accordance with an embodiment, to which the electronic device illustrated in FIGS. 1 to 17 is applied.

FIG. 18 is a block diagram illustrating a configuration of an electronic system 1000 in accordance with an embodiment of the present disclosure. As illustrated in FIG. 18, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and electronic devices 1400(K:1). The controller 1300 may control the electronic devices 1400(K:1) such that the electronic devices 1400(K:1) perform a first operation mode and a second operation mode depending on an operating speed during a data alignment operation. Each of the electronic devices 1400(K:1) may perform the first operation mode in which, during the data alignment operation, a pulse amplitude of data is adjusted to four levels and 2-bit data is input/output per pulse and the second operation mode in which, during the data alignment operation, a bit of a logic high level and a bit of a logic low level in data each maintain its logic level till a time point when a next bit is input. Each of the electronic devices 1400(K:1) may secure the reliability of the data alignment operation by selectively performing the first operation mode and the second operation mode in conformity with a high-speed operation and a low-speed operation during the data alignment operation.

Each of the electronic devices 1400(K:1) may be implemented by the electronic device 10 illustrated in FIG. 1. According to an embodiment, each of the electronic devices 1400(K:1) may be implemented by one among a DRAM (dynamic random access memory), a PRAM (phase change random access memory), an RRAM (resistive random access memory), an MRAM (magnetic random access memory) and an FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An electronic device comprising:
   a comparison circuit configured to generate first to third comparison signals by receiving input data having any one level among a first level to a fourth level in a first operation mode, and generate the second comparison signal by receiving the input data having any one level of the first level and the fourth level in a second operation mode;
   a sampling circuit configured to generate first to third sampling data from the first to third comparison signals in synchronization with a sampling clock in the first operation mode, and generate the second sampling data from the second comparison signal in the second operation mode; and
   an alignment circuit configured to align the first to third sampling data in synchronization with an alignment clock and an output clock and generate alignment data on the basis of the aligned first to third sampling data, or align the second sampling data in synchronization with the alignment clock and the output clock and generate the alignment data on the basis of the aligned second sampling data.

2. The electronic device according to claim 1, further comprising:
   a control circuit configured to generate a selection signal for selecting the first operation mode or the second operation mode when a mode register set signal or a test mode signal is input.

3. The electronic device according to claim 1, wherein a pulse included in the input data is input from an external device while including 2-bit information in the first operation mode, and a pulse included in the input data is input from the external device while including 1-bit information in the second operation mode.

4. The electronic device according to claim 1, wherein
   the comparison circuit generates the first to third comparison signals by comparing the input data and first to third reference voltages in the first operation mode, and
   the comparison circuit generates the second comparison signal by comparing the input data and the second reference voltage in the second operation mode.

5. The electronic device according to claim 1, wherein
in the first and second operation modes, the sampling clock is generated to have a frequency ½ times a frequency of a write clock,
in the first operation mode, the alignment clock is generated to have a frequency ½ times the frequency of the write clock, and the output clock is generated to have a frequency ¼ times the frequency of the write clock, and
in the second operation mode, the alignment clock is generated to have a frequency ¼ times the frequency of the write clock, and the output clock is generated to have a frequency ⅛ times the frequency of the write clock.

6. The electronic device according to claim 4, wherein the comparison circuit comprises:
a first comparator configured to operate when the selection signal is enabled, and generate the first comparison signal by comparing the first reference voltage and the input data;
a second comparator configured to generate the second comparison signal by comparing the second reference voltage and the input data; and
a third comparator configured to operate when the selection signal is enabled, and generate the third comparison signal by comparing the third reference voltage and the input data.

7. The electronic device according to claim 4, wherein
the first reference voltage is a voltage which has a level between the fourth level of the input data and the third level of the input data,
the second reference voltage is a voltage which has a level between the third level of the input data and the second level of the input data, and
the third reference voltage is a voltage which has a level between the second level of the input data and the first level of the input data.

8. The electronic device according to claim 1, wherein the alignment circuit comprises:
an encoder configured to generate encoding data by encoding the first to third sampling data in the first operation mode based on the selection signal;
a first alignment circuit configured to generate pre-alignment data by aligning the encoding data in synchronization with the alignment clock in the first operation mode based on the selection signal, and generate the pre-alignment data by aligning the second sampling data in synchronization with the alignment clock in the second operation mode based on the selection signal; and
a second alignment circuit configured to generate the alignment data by aligning the pre-alignment data in synchronization with the output clock.

9. An electronic device comprising:
a clock dividing circuit configured to generate first to fourth sampling clocks, first to fourth alignment clocks and first and second output clocks by dividing a frequency of a write clock; and
a data alignment circuit configured to, in a first operation mode, receive input data having any one level among a first level to a fourth level and generate alignment data by aligning the input data in synchronization with the first to fourth sampling clocks, the first to fourth alignment clocks and the first and second output clocks, and to, in a second operation mode, receive the input data having any one level of the first level and the fourth level and generate the alignment data by aligning the input data in synchronization with the first to fourth sampling clocks, the first to fourth alignment clocks and the first and second output clocks.

10. The electronic device according to claim 9, further comprising:
a control circuit configured to generate a selection signal for selecting the first operation mode or the second operation mode when a mode register set signal or a test mode signal is input.

11. The electronic device according to claim 9, wherein a pulse of the input data is input from an external device while including 2-bit information in the first operation mode, and a pulse of the input data is input from the external device while including 1-bit information in the second operation mode.

12. The electronic device according to claim 9, wherein the input data is a signal input in series to include a plurality of bits which are sequentially input, and the alignment data is a signal generated in parallel to include a plurality of bits which are simultaneously generated.

13. The electronic device according to claim 9, wherein the first to fourth sampling clocks are signals which have a phase difference of ninety degrees (90°), the first to fourth alignment clocks are signals which have a phase difference of 90°, and the first and second output clocks are signals which have a phase difference of one hundred and eighty degrees (180°).

14. The electronic device according to claim 9, wherein the clock dividing circuit comprises:
a first divider configured to generate first to fourth internal clocks by dividing by 2, the frequency of the write clock;
a second divider configured to generate first to fourth divided clocks by dividing by 2, frequencies of the first to fourth internal clocks;
a third divider configured to generate first and second pre-output clocks by dividing by 2, a frequency of the third divided clock; and
a clock selection circuit configured to generate the first to fourth sampling clocks from the first to fourth internal clocks, and generate the first to fourth alignment clocks and the first and second output clocks from the first to fourth internal clocks, the first to fourth divided clocks and the first and second pre-output clocks depending on a logic level of the selection signal.

15. The electronic device according to claim 9, wherein the data alignment circuit comprises:
a comparison circuit configured to generate first to third comparison signals by receiving the input data having any one level among the first level to the fourth level in the first operation mode, and generate the second comparison signal by receiving the input data having any one level of the first level and the fourth level in the second operation mode;
a sampling circuit configured to generate first to third sampling data from the first to third comparison signals in synchronization with a sampling clock in the first operation mode, and generate the second sampling data from the second comparison signal in the second operation mode; and
an alignment circuit configured to align the first to third sampling data in synchronization with the first to fourth alignment clocks and the first and second output clocks and generate the alignment data on the basis of the aligned first to third sampling data, or align the second sampling data in synchronization with the first to fourth alignment clocks and the first and second output clocks and generate the alignment data on the basis of the aligned second sampling data.

16. The electronic device according to claim 15, wherein the comparison circuit generates the first to third comparison signals by comparing the input data and first to third reference voltages in the first operation mode, and the comparison circuit generates the second comparison signal by comparing the input data and the second reference voltage in the second operation mode.

17. The electronic device according to claim 16, wherein the comparison circuit comprises:

a first comparator configured to operate when the selection signal is enabled, and generate the first comparison signal by comparing the first reference voltage and the input data;

a second comparator configured to generate the second comparison signal by comparing the second reference voltage and the input data; and a third comparator configured to operate when the selection signal is enabled, and generate the third comparison signal by comparing the third reference voltage and the input data.

18. The electronic device according to claim 17, wherein the selection signal is a signal which is enabled to perform the first operation mode.

19. The electronic device according to claim 17, wherein the first comparator generates the first comparison signal which is enabled when the input data has the fourth level, the second comparator generates the second comparison signal which is enabled when the input data has a level equal to or higher than the third level, and the third comparator generates the third comparison signal which is enabled when the input data has a level equal to or higher than the second level.

20. The electronic device according to claim 15, wherein the alignment circuit comprises:

an encoder configured to generate encoding data by encoding the first to third sampling data in the first operation mode based on the selection signal;

a first alignment circuit configured to generate pre-alignment data by aligning the encoding data in synchronization with the first to fourth alignment clocks in the first operation mode based on the selection signal, and generate the pre-alignment data by aligning the second sampling data in synchronization with the first to fourth alignment clocks in the second operation mode based on the selection signal; and a second alignment circuit configured to generate the alignment data by aligning the pre-alignment data in synchronization with the first and second output clocks.

* * * * *